(12) United States Patent
Tripurari et al.

(10) Patent No.: US 9,455,757 B2
(45) Date of Patent: Sep. 27, 2016

(54) CIRCUITS AND METHODS FOR PERFORMING HARMONIC REJECTION MIXING

(71) Applicant: The Trustees of Columbia University in the City of New York, New York, NY (US)

(72) Inventors: Karthik Tripurari, New York, NY (US); Peter R. Kinget, Summit, NJ (US); Harish Krishnaswamy, New York, NY (US); Teng Yang, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 14/415,914

(22) PCT Filed: Jul. 19, 2013

(86) PCT No.: PCT/US2013/051338
§ 371 (c)(1),
(2) Date: Jan. 20, 2015

(87) PCT Pub. No.: WO2014/015277
PCT Pub. Date: Jan. 23, 2014

(65) Prior Publication Data
US 2015/0180521 A1 Jun. 25, 2015

Related U.S. Application Data

(60) Provisional application No. 61/673,674, filed on Jul. 19, 2012.

(51) Int. Cl.
| | |
|---|---|
| *H04B 1/12* | (2006.01) |
| *H03D 7/14* | (2006.01) |
| *H04L 25/14* | (2006.01) |

(52) U.S. Cl.
CPC ............ *H04B 1/123* (2013.01); *H03D 7/1441* (2013.01); *H03D 7/1458* (2013.01); *H04L 25/14* (2013.01); *H03D 2200/0086* (2013.01)

(58) Field of Classification Search
CPC ....... H03L 7/1974; H04B 1/10; H04B 1/123; H04B 1/109; H04B 1/30; H04W 56/003; H03D 7/163; H03D 7/165; H03D 2200/0086; H03D 1/2209; H03D 7/1466; H03D 7/1475; H03D 7/166; H03D 7/1441; H03D 7/1458; H03F 3/195; H03F 3/211; H03F 1/32; H03F 2200/294; H01F 27/385; H04L 25/14
See application file for complete search history.

(56) References Cited

U.S. PATENT DOCUMENTS 7,509,110 B2 * 3/2009 Hayashi ............... H03D 7/1441
455/302
8,422,975 B2 * 4/2013 Behera ................. H03D 7/165
455/114.1

(Continued)

OTHER PUBLICATIONS

Bagheri, R. et al. "An 800-MHz-6-GHz Software-Defined Wireless Receiver in 90-nm CMOS", In IEEE Journal of Solid-State Circuits, vol. 41, No. 12, Dec. 2006, pp. 2860-2876.

(Continued)

*Primary Examiner* — Vineeta Panwalkar
(74) *Attorney, Agent, or Firm* — Byrne Poh LLP

(57) ABSTRACT

Circuits and methods for performing harmonic rejection mixing are provided. In some embodiments, the circuit comprises: a first amplifier that amplifies a received signal at a first gain; a second amplifier that amplifies the received signal at a fraction of the first gain; a mixer that receives a local oscillator signal having a first fundamental frequency and the first amplifier output, and outputs a first mixed signal; a second mixer that receives a second local oscillator signal having a fundamental frequency that is a multiple of the first fundamental frequency and the second amplifier output, and outputs a second mixed signal; and an output stage that receives the first and second mixed signals and outputs a sum of the first and second mixed signals.

20 Claims, 15 Drawing Sheets

(56) References Cited

U.S. PATENT DOCUMENTS

2008/0194222 A1* 8/2008 Liu .................. H03D 7/1441
455/296
2010/0283526 A1* 11/2010 Van Sinderen ...... H03D 7/1441
327/361

OTHER PUBLICATIONS

Bagheri, R. et al., "An 800MHz to 5GHz Software-Defined Radio Receiver in 90nm CMOS", In IEEE International Solid-State Circuits Conference, Feb. 2006, pp. 1932-1941.

Cha, H.-K. et al., "A CMOS Harmonic Rejection Mixer with Mismatch Calibration Circuitry for Digital TV Tuner Applications", In IEEE Microwave and Wireless Components Letters, vol. 18, No. 9, Sep. 2008, pp. 617-619.

Gupta, M. et al., "A 48-to-860MHz CMOS Direct-Conversion TV Tuner", In IEEE International Solid-State Circuits Conference, Feb. 2007, pp. 206-597.

International Search Report and Written Opinion dated Oct. 16, 2013 in International Patent Application No. PCT/US2013/051338.

Lerstaveesin, S. et al., "A 48-860MHz CMOS Low-IF Direct-Conversion DTV Tuner", In IEEE Journal of Solid-State Circuits, vol. 43, No. 9, Sep. 2008, pp. 2013-2024.

Maxim, A. et al., "A DDFS Driven Mixing-DAC with Image and Harmonic Rejection Capabilities", In IEEE International Solid-State Circuits Conference Digest of Technical Papers, Feb. 2008, pp. 372-621.

Mitloa, J., "The Software Radio Architecture", In IEEE Communications Magazine, vol. 33, No. 5, May 1995, pp. 26-38.

Moseley, N.A. et al., "A 400-to-900 MHz Receiver with Dual-Domain Harmonic Rejection Exploiting Adaptive Interference Cancellation", In IEEE International Solid-State Circuits Conference—Digest of Technical Papers, Feb. 2009, pp. 232-233a.

Rafi, A.A. et al., "A Harmonic Rejection Mixer Robust to RF Device Mismatches", In IEEE International Solid-State Circuits Conference Digest of Technical Papers, Feb. 2011, pp. 66-68.

Ru, Z. et al., "A Discrete-Time Mixing Receiver Architecture with Wideband Harmonic Rejection", In IEEE International Solid-State Circuits Conference, Technical Papers, Feb. 2008, pp. 322-616.

Ru, Z. et al., "A Software-Defined Radio Receiver Architecture Robust to Out-of-Band Interference", In IEEE International Solid-State Circuits Conference—Digest of Technical Papers, Feb. 2009, pp. 230-231a.

Ru, Z. et al., "Digitally Enhanced Software-Defined Radio Receiver Robust to Out-of-Band Interference", In IEEE Journal of Solid-State Circuits, vol. 44, No. 12, Dec. 2009, pp. 3359-3375.

Ru, Z. et al., "Discrete-Time Mixing Receiver Architecture for RF-Sampling Software-Defined Radio", In IEEE Journal of Solid-State Circuits, vol. 45, No. 9, Sep. 2010, pp. 1732-1745.

Weldon, J.A. et al. "A 1.75-GHz Highly Integrated Narrow-Band CMOS Transmitter with Harmonic-Rejection Mixers", In IEEE Journal of Solid-State Circuits, vol. 36, No. 12, Dec. 2001, pp. 2003-2015.

Weldon, J.A. et al., "A 1.75 GHz Highly-Integrated Narrow-Band CMOS Transmitter with Harmonic-Rejection Mixers", In IEEE International Solid-State Circuits Conference, Feb. 7, 2001, pp. 160-161.

* cited by examiner

CIRCUITS AND METHODS FOR PERFORMING HARMONIC REJECTION MIXING

CROSS-REFERENCE TO RELATED APPLICATION

This application claims the benefit of U.S. Provisional Patent Application No. 61/673,674, filed Jul. 19, 2012, which is hereby incorporated by reference herein in its entirety.

STATEMENT REGARDING FEDERALLY SPONSORED RESEARCH OR DEVELOPMENT

This invention was made with government support under Grant No. FA8650-11-1-7159 awarded by the Defense Advanced Research Projects Agency (DARPA) and Award No. 1002064 awarded by the National Science Foundation. The government has certain rights in the invention.

TECHNICAL FIELD

The disclosed subject matter relates to circuits and methods for performing harmonic rejection mixing.

BACKGROUND

In general, switching mixers can be used to convert an input at a first frequency into an output at a second frequency. A switching mixer that has inputs at frequencies $f_1$ and $f_2$ can create outputs at output frequencies that are the absolute value of the sum and difference of the input frequencies (e.g., $|f_1 \pm f_2|$). When used to up-convert or down-convert a target input frequency to a desired output frequency, the inputs to a switching mixer are generally an input signal at a target frequency and a local oscillator at a frequency appropriate to convert the target input frequency to a desired output frequency.

Switching mixers can be used to up-convert an input signal from a lower frequency to a much higher frequency (e.g., using a local oscillator signal having a much higher frequency than the target frequency) or to down-convert an input signal from a higher frequency to a lower frequency (e.g., by using a local oscillator having a frequency that is relatively close to the frequency of the input signal).

The local oscillator signal can include a fundamental frequency and various harmonics of the fundamental frequency. For example, depending on the shape and/or duty cycle of the local oscillator signal, harmonics can be generated at the second harmonic, third harmonic, fourth harmonic, etc., of the fundamental frequency. Using a square wave with a fifty percent duty cycle as the local oscillator signal can eliminate the even harmonics of the fundamental frequency, leaving only the odd harmonics (e.g., the third, fifth, seventh, etc.).

Due to the harmonics of the local oscillator signal, signals that are not at the target frequency in the input signal can be up-converted or down-converted to the desired frequency. For example, if the target input frequency is 500 megahertz (MHz) and the desired output frequency is 10 MHz, a local oscillator with a fundamental frequency of 510 MHz can be used. If the local oscillator signal is a square wave with a 50% duty cycle, the local oscillator signal can also include the odd harmonics of the fundamental frequency at 1530 MHz, 2550 MHz, and so on. These harmonics can mix with signals at 1520 MHz, 1540 MHz, 2540 MHz, and 2560 MHz in the input signal to create signals at the desired frequency of 10 MHz. These undesired signals can create interference and/or noise by combining with the output created by mixing the signal at the target input signal with the fundamental frequency of the local oscillator.

Several approaches to limiting such undesired signals have been suggested. One such approach is using preconditioning circuits, such as tunable band pass or low pass filters, to eliminate signals that may combine with harmonics of the local oscillator to create undesired signals. Using such preconditioning circuitry can introduce complexity and cost into the circuit and a band pass filter can be difficult to tune for wideband applications.

Another approach that has been suggested is a classic harmonic rejection mixer which uses three alternate paths having gains of 1, $\sqrt{2}$, and 1, respectively. In the classic harmonic rejection mixer, each path includes a switching mixer that mixes the input signal and the local oscillator signal. The phase of the local oscillator signal is offset in the paths with unity gain by 45 degrees and negative 45 degrees, respectively, compared to the path with a gain of $\sqrt{2}$. The signals generated by the mixers on the three paths can be combined, which theoretically cancels out the components of the output signal generated by the third and fifth harmonics of the local oscillator's fundamental frequency. The advantage of the classic harmonic rejection mixer is that it cancels (or rejects) undesired signals at the desired output frequency, without requiring extensive preconditioning circuitry. However, in practice, creating an amplifier with a gain of $\sqrt{2}$ is difficult. Device size ratios to control the path gains can be made accurately for rational fractions, but $\sqrt{2}$ is an irrational number that is difficult to approximate using a rational fraction. Because of the need to approximate $\sqrt{2}$, a harmonic rejection ratio (e.g., how much power of the undesired signals generated by the harmonics of the local oscillator are cancelled) achievable by the classic harmonic rejection mixer is degraded due to gain inaccuracies between the three paths.

Therefore, there is a need for new circuits and methods for performing harmonic rejection mixing.

SUMMARY

In accordance with various embodiments of the disclosed subject matter, circuits and methods for performing harmonic rejection mixing are provided.

In accordance with some embodiments of the disclosed subject matter, a circuit for performing harmonic rejection mixing is provided, the circuit comprising: a first amplifier that outputs a first amplified signal by amplifying a received signal using a first gain: a second amplifier that outputs a second amplified signal by amplifying the received signal using a second gain that is a fraction of the first gain; a first mixer that receives (i) a first local oscillator signal having a first fundamental frequency and (ii) the amplified output of the first amplifier, and outputs a first mixed signal created by mixing the first local oscillator signal with the amplified output of the first amplifier; a second mixer that receives (iii) a second local oscillator signal having a second fundamental frequency that is a multiple of the first fundamental frequency and (iv) the amplified output of the second amplifier, and outputs a second mixed signal created by mixing the second local oscillator signal with the amplified output of the second amplifier; and an output stage that receives the first mixed signal the second mixed signal and outputs a combined signal that includes a sum of the first mixed signal and the second mixed signal.

In accordance with some embodiments of the disclosed subject matter, a method for performing harmonic rejection mixing is provided, the method comprising: amplifying a received signal using a first gain to produce a first amplified signal; amplifying the receive signal using a second gain that is a fraction of the first gain to produce a second amplified signal; mixing (i) a first local oscillator signal having a first fundamental frequency and (ii) the first amplified signal to produce a first mixed signal; mixing (iii) a second local oscillator signal having a second fundamental frequency that is a multiple of the first fundamental frequency and (iv) the second amplified signal to produce a second mixed signal; outputting a combined signal by summing the first mixed signal and the second mixed signal.

In accordance with some embodiments, a method for controlling a harmonic rejection mixer is provided, the method comprising: setting a fundamental frequency of a first local oscillator signal and a fundamental frequency of a second local oscillator signal to default frequencies based on a target input frequency and a desired output frequency; setting control voltages that control a gain of a first transconductor and a gain of a second transconductor to default voltages; providing an input to the first transconductor and the second transconductor at a frequency that is the second local oscillator frequency plus the desired output frequency; (a) measuring a power of a signal from an output stage that combines outputs from a first mixer that mixes a signal output by the first transconductor with the first local oscillator signal and a second mixer that mixes a signal output by the second transconductor with the second local oscillator signal; (b) adjusting a control voltage that controls the gain of the second transconductor; (c) repeating (a) and (b) until a power of the signal from the output stage is minimized; and causing a value of the control voltage that controls the gain of the second transconductor to be stored in a lookup table.

In accordance with some embodiments of the disclosed subject matter, a circuit for performing harmonic rejection mixing is provided, the circuit comprising: means for outputting a first amplified signal by amplifying a received signal using a first gain: means for outputting a second amplified signal by amplifying the received signal using a second gain that is a fraction of the first gain; means for outputting a first mixed signal created by mixing the first local oscillator signal with the amplified output of the first amplifier; means for outputting a second mixed signal created by mixing the second local oscillator signal with the amplified output of the second amplifier; and means for outputting a combined signal that includes a sum of the first mixed signal and the second mixed signal.

In some embodiments, the circuit further comprises: means for outputting a third amplified signal by amplifying the received signal using a third gain that is a second fraction of the first gain; means for outputting a third mixed signal created by mixing the second local oscillator signal with the amplified output of the second amplifier; and wherein the means for outputting the combined signal further includes means for receiving the third mixed signal, and wherein the combined signal includes a sum of the first mixed signal, the second mixed signal and the third mixed signal.

In some embodiments, a rising edge of the second local oscillator signal and a rising edge of the second local oscillator signal are substantially aligned with a falling edge of the first local oscillator signal.

In some embodiments, the means for outputting the first amplified signal includes means for converting the received signal from a voltage signal to a first current signal using the first gain, and the means for outputting the second amplified signal includes means for converting the received signal from the voltage signal to a second current signal using the second gain.

In some embodiments, the first mixed signal is a current signal based on the first current signal output by the first transconductor and the second mixed signal is a current signal based on the second current signal output by the second transconductor.

In some embodiments, means for outputting the combined signal include means for receiving the first mixed signal and the second mixed signal; means for combing the summing the first mixed signal and the second mixed signal; and means for converting the combined signal from a current signal to a voltage signal.

In some embodiments, a transconductance of the means for converting the received signal to the first current signal is set at about three times the transconductance of the means for converting the received signal to the second current signal.

In some embodiments, means for changing a degenerative resistance of the means for converting the received signal to the first current signal is based on a control voltage, and wherein an effective transconductance of the means for converting the received signal to the first current signal is based on the degenerative resistance.

In some embodiments, a ratio of the first gain to the second gain is 3:1.

In some embodiments, the second fundamental frequency is about three times the first fundamental frequency.

In some embodiments, the received signal is an RF signal and wherein the first mixed signal and the second mixed signal are IF signals.

In some embodiments, wherein the received signal is an IF signal and wherein the first mixed signal and the second mixed signal are RF signals.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION

Figure 1:
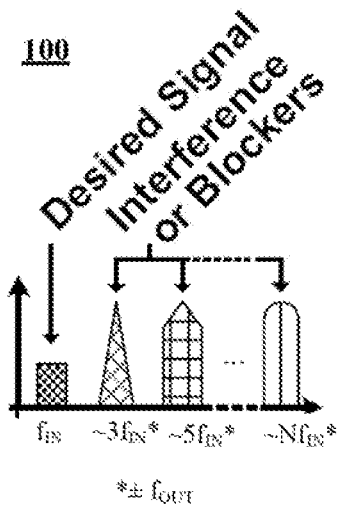
FIG. 1 shows an example of signals that can be generated at a desired output frequency from various harmonics of a local oscillator signal used to drive a switching mixer in accordance with some embodiments of the disclosed subject matter.

In accordance with various embodiments, mechanisms for performing harmonic rejection mixing are provided. In accordance with some embodiments, mechanisms for performing harmonic rejection mixing can include a main path and various auxiliary paths. The main path and each auxiliary path can include an amplifier and a switching mixer. In such embodiments, an input signal can be received on the main path and each of the auxiliary paths. The mixer on the main path can be used to down-convert (or up-convert) a signal in the input signal that has a target frequency to a desired output frequency. The mixers on the auxiliary paths can be used to create signals that cancel signals created from harmonics of a local oscillator used to down-convert (or up-convert) the input signal at the target frequency. In some embodiments, a separate auxiliary path can be provided for one or more harmonics to be cancelled. For example, a first auxiliary path can be provided to cancel the signal created by the third harmonic of the local oscillator, a second auxiliary path can be provided to cancel the signal created by the fifth harmonic of the local oscillator, etc.

In some embodiments, a local oscillator signal input to mixers on the auxiliary paths can have a fundamental frequency that is a multiple of the local oscillator signal used in the mixer in the main path. For example, if the fundamental frequency of the local oscillator used as an input to the mixer in the main path is $f_0$, the fundamental frequency of the local oscillator used as an input to the mixer in the auxiliary path for the third harmonic can be $3f_0$. Similarly, the fundamental frequency of the local oscillator used as an input to the mixer in the auxiliary path for the fifth harmonic can be $5f_0$, and so on.

In some embodiments, the gain of the amplifiers in each auxiliary path can be set to a predetermined fraction of the gain of the amplifier in the main path. For example, the gain of the amplifier of the auxiliary path for the third harmonic can be set so that a signal created by the mixer in the auxiliary path for the third harmonic has an amplitude that is substantially equal to the amplitude of a signal created in the main path by the third harmonic of the local oscillator. Additionally or alternatively, the amplifiers on the main path and the auxiliary path or paths can include multiple amplifiers that have an effective gain equal to a desired gain for the path.

In some embodiments, a square wave ($g_T(t)$) used as a local oscillator signal can be described by the following:

$$g_T(t) = \Sigma_{n=-\infty}^{\infty} g(t-nT+t_0), \quad (1)$$

where g(t) is a single period signal, n is the range over which g(t) is summed, T is the period of the square wave (equal to the inverse of the local oscillator frequency, i.e., $$\frac{1}{f_{LO}}),$$

$t_0$ is a time offset of the square wave, and g(t) can be defined as:

$$g(t) = \begin{cases} A, & |t| < \frac{T}{2}D \\ 0, & \text{elsewhere} \end{cases} \quad (2)$$

where A is the amplitude of the square wave, and D is the duty cycle of the square wave defined as $$\frac{\tau}{T},$$

where τ is the pulse width or me square wave.

In some embodiments, a square wave can be described as a Fourier series with the following coefficients:

$$a_k = AD\text{sinc}(kD)e^{j2\pi k \frac{t_0}{T}}, \quad (3)$$

where k∈ℤ, and where ℤ is the set of all integers. In some embodiments, D=½ can be used and the other coefficients can be set as $t_0=0$ and A=1, so that equation (3) can be rewritten as the following:

$$a_k = \frac{1}{2}\text{sinc}\left(\frac{k}{2}\right) = \frac{1}{k\pi}(-1)^{\frac{k-1}{2}}. \quad (4)$$

In some embodiments, a signal used to generate the square wave can be AC coupled, resulting in a square wave that has a DC component that is zero (i.e., there is no DC offset and $a_0=0$).

Using equation (4), the magnitude of the frequency components of the square wave at the first harmonic (k=1, i.e., a frequency $f_{LO}$), can be $$\frac{1}{\pi},$$

at the third harmonic (k=3, i.e., a frequency of $3f_{LO}$) can be $$\frac{1}{3\pi},$$

at the fifth harmonic (k=5, i.e., a frequency of $5f_{LO}$) can be $$\frac{1}{5\pi},$$

etc.

In some embodiments, the gain of the amplifier in an auxiliary path for cancelling noise caused by the third harmonic of the local oscillator (e.g., a first auxiliary path) can be set to one third of the gain of the amplifier in the main path, the gain of the amplifier in an auxiliary path for cancelling noise caused by the fifth harmonic of the local oscillator (e.g., a second auxiliary path) can be set to one fifth of the gain of the amplifier in the main path, etc.

In some embodiments, signals output by the switching mixers in each auxiliary path can be combined (e.g., added, subtracted, etc.) with signals output by the switching mixer in the main path. By setting the gains to predetermined ratios of the gain of the main path, undesired signals at the desired output frequency can be cancelled (e.g., rejected) from the output signal on the main path.

Turning to FIG. 1, an example 100 of a spectrum of an input signal is shown in accordance with some embodiments. Such an input signal can include a desired input signal component (e.g., $f_{IN}$) and undesired input signal components (e.g., $3f_{IN}\pm f_{OUT}$, $3f_{IN}\pm f_{OUT}$, $Nf_{IN}\pm f_{OUT}$, etc., in the case of a down converter). In some embodiments, mixing this input signal (e.g., containing components ($f_{IN}$, $3f_{IN}\pm f_{OUT}$, $3f_{IN}\pm f_{OUT}$, $Nf_{IN}\pm f_{OUT}$, etc.) with the fundamental frequency ($f_{LO}$) of a local oscillator (LO) signal and odd harmonics of the fundamental frequency (e.g., frequencies at $3f_{LO}$, $5f_{LO}$, $Nf_{LO}$, etc.) (e.g., as described below in connection with FIG. 2) can result in undesired components in the output signal due to the undesired components in the input signal. Note that the magnitudes and pulse shapes of the desired output and noise caused by harmonics of the local oscillator are not shown to scale or shown with any particular shape, but instead are shown to illustrate the operation of a harmonic rejection mixer (e.g., harmonic rejection mixer 200, described below in connection with FIG. 2). In some embodiments, the fundamental frequency of the local oscillator ($f_{LO}$) can be about equal to frequency of the target input signal component. For example, in the case of a zero-IF or direct conversion mixer, a fundamental frequency of the local oscillator ($f_{LO}$) can be set to the frequency of the target input signal component ($f_{IN}$).

Figure 2:
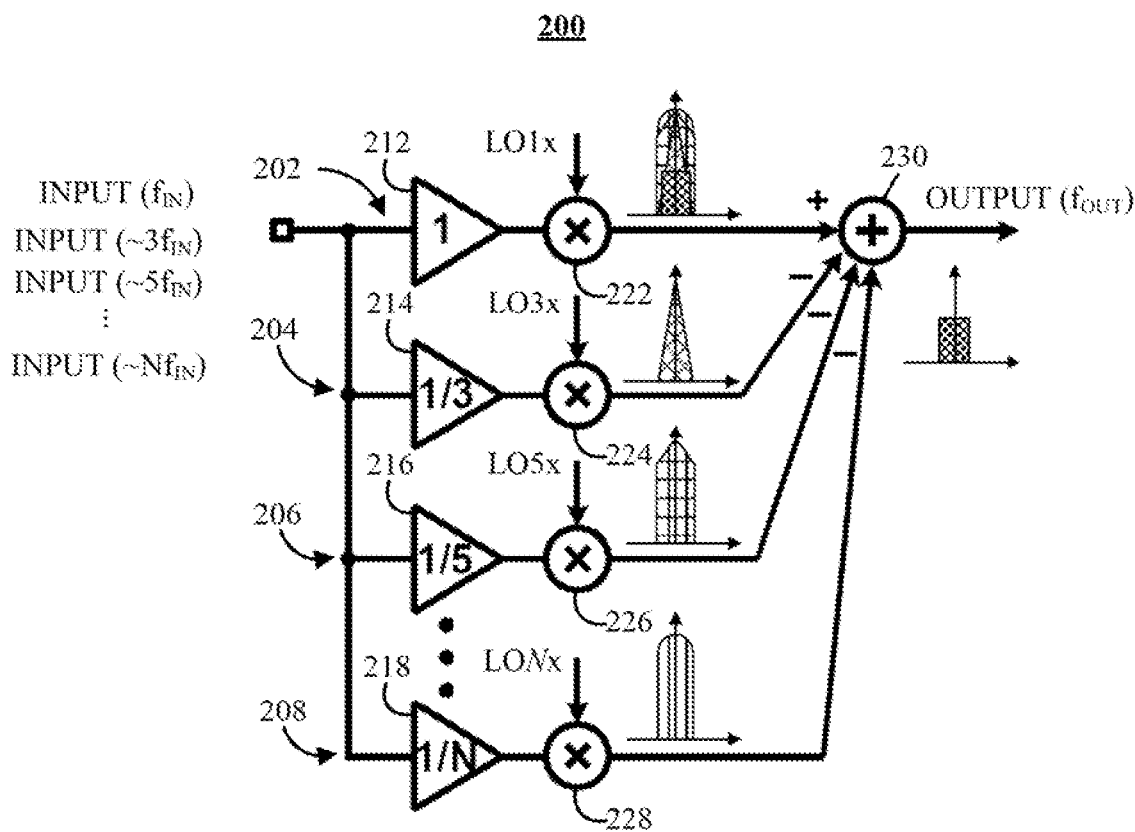
FIG. 2 shows an example of a block diagram of a reconfigurable harmonic rejection mixer in accordance with some embodiments of the disclosed subject matter.

FIG. 2, an example 200 of a block diagram showing a reconfigurable harmonic rejection mixer (HRM) architecture in accordance with some embodiments of the disclosed subject matter. As shown in FIG. 2, in some embodiments, HRM 200 can receive an input signal at a target input frequency (Input($f_{IN}$)). HRM 200 can include a main path 202 and one or more auxiliary paths 204-208 that each can receive the input signal. In some embodiments, each path 202-208 can include a corresponding amplifier 212-218. Each amplifier 212-218 can be controlled and/or manufactured to provide a predetermined gain on the input signal as shown in FIG. 2. For example, the gain of amplifier 212 on main path 202 can be controlled to be a multiple of each of the gains of paths 204-206 (e.g., a least common multiple of the gains of amplifiers 214-218). As another example, the gain of amplifiers 214-218 can be one-third, one-fifth, and one-nth of the gain of amplifier 212, respectively. In some embodiments, amplifiers 212-218 can be transconductance amplifiers that output a current signal that is proportional to a voltage input signal.

In some embodiments, the signal output from amplifier 212 can be input to a switch 222 to be mixed with a local oscillator signal (LO1x) having a predetermined fundamental frequency (e.g., $f_{LO}$) to provide a desired output signal (OUTPUT($f_{OUT}$)) at a desired output frequency (e.g., $f_{OUT}$). In some embodiments, $f_{LO}$ can be determined based on the target input frequency (e.g., $f_{IN}$) and the desired output frequency (e.g., $f_{OUT}$). As described above, the local oscillator signal can include harmonics of the fundamental frequency (e.g., $2f_{LO}$, $3f_{LO}$, $4f_{LO}$, $5f_{LO}$, etc.).

In some embodiments, the amplified signal output by amplifier 212 can be a first input to a switching mixer 222 and the local oscillator signal can be a second input to switching mixer 222. In general, a switching mixer (e.g., such as switching mixer 222) that has inputs at frequencies $f_1$ and $f_2$ can create outputs at a first output frequency that is the absolute value of the sum and difference of the input frequencies (e.g., |f₁±f₂|). Therefore, in some embodiments, the output signal (s_{OUT}) of switching mixer 222 can include the sum and difference of the local oscillator frequency (e.g., $f_{LO}$) and the target input frequency (e.g., $f_{IN}$). That is, the signal at the output of mixer 222 (s_{OUT}) can include signals at $|f_{LO} \pm f_{LO} \pm f_{IN}|$. In the case of down conversion, the component of the output signal at the higher, summed frequency (e.g., $f_{LO}+f_{IN}$) can generally be disregarded, leaving the desired output component with frequency $f_{OUT}=|f_{LO}-f_{IN}|$.

As described above, harmonics in the local oscillator can cause signals at other frequencies than the target frequency that are present in the input signal to be down-converted to the desired frequency. For example, the input signal can include signals with frequencies that are close to harmonics of the local oscillator frequency (e.g., $\sim 3f_{LO} \pm f_{OUT}$, $\sim 5f_{LO} \pm f_{OUT}$, $\sim 7f_{LO} \pm f_{OUT}$, etc.). In a more particular example, if the target input frequency is 500 megahertz (MHz), and the desired output frequency is 10 MHZ, the local oscillator frequency can be set at either 490 MHz or 510 MHz. In this example, 510 MHz is used for convenience. In such an example, the input signal can include a signal at 500 MHz (e.g., the target frequency), a signal at 1520 MHz and/or 1540 MHz (i.e., a non-targeted frequency at about three times the target frequency), a signal at 2540 MHz and/or 2560 MHz (i.e., a non-targeted frequency at about five times the target frequency), and so on (e.g., other non-target frequencies that are offset from a harmonic of the oscillator frequency by the desired output frequency). In this example, when the input signal is mixed with the local oscillator, the output of switching mixer 122 can include components caused by mixing the fundamental frequency of the local oscillator (e.g., 510 MHz) with the input signal at the target frequency (e.g., 500 MHz), as well as components caused by mixing the third harmonic of the local oscillator (e.g., 1530 MHz) with the input signal at about three times the target input frequency (e.g., 1520 MHz and/or 1540 MHz), components caused by mixing the fifth harmonic of the local oscillator (e.g., 2550 MHz) with the input signal at about five times the target input frequency (e.g., 2540 MHz and/or 2560 MHz), etc. Therefore, the output of switch 122 can include the desired output signal (e.g., $s_{OUT}(f_{LO})$), and undesired output components caused by mixing with harmonics of the local oscillator signal (e.g., signals $s_{OUT}(3f_{LO})$, $s_{OUT}(5f_{OUT})$, $s_{OUT}(Nf_{OUT})$, etc.).

In some embodiments, the signal output from amplifiers 214-218 can be input to switches 224-228, respectively, to be mixed with local oscillator signals (e.g., signals LO3x, LO5x, LONx) having fundamental frequencies (e.g., fundamental frequencies $3f_{LO}$, $5f_{LO}$, NU, respectively) that are multiples of the fundamental frequency ($f_{LO}$) of the local oscillator signal LO1x to produce a signal corresponding to a signal or signals at the desired output frequency caused by mixing the input signal at mixer 222 (e.g., $s_{OUT}(3f_{LO})$, $s_{OUT}(5f_{LO})$, $s_{OUT}(Nf_{LO})$, etc.). In some embodiments, each auxiliary path can be activated or deactivated separately to control whether to mix the input signal with a corresponding multiple of the local oscillator signal. For example, if the input signal has no signal or a very low signal at a frequency that would cause noise in the output signal by mixing with the third harmonic of the local oscillator, the first auxiliary path can be disabled. In such an example, if the input signal has a signal that would cause noise in the output signal by mixing with the fifth harmonic of the local oscillator, the second auxiliary path can be enabled. In some embodiments, disabling auxiliary paths can reduce power use by the harmonic rejection mixer.

In some embodiments, one or more harmonics in the output signal from switch 222 can be cancelled by adding or subtracting signals generated on auxiliary paths 204-208. For example, as shown in FIG. 2, signals from auxiliary paths 204-208 output by switches 224-228 can be subtracted from the signal output from switch 222 (e.g., including desired output signal $s_{OUT}(f_{LO})$ and signals $s_{OUT}(3f_{LO})$, $s_{OUT}(5f_{LO})$, $s_{OUT}(Nf_{LO})$, etc., caused by one or more harmonics of the local oscillator) at an output stage 230. In some embodiments, the output from output stage 130 can include the desired output signal at the desired output frequency $f_{OUT}$.

In some embodiments, local oscillator signals LO1x, LO3x, LO5x and LONx can be square waves with a duty cycle of about fifty percent. A Fourier transform for describing the local oscillator signals of FIG. 2 can be approximated by the following:

$$LO1x(f) = \sum_{k=-\infty}^{\infty} \text{sinc}\left(\frac{k}{2}\right) * \delta(f - kf_{LO}), \qquad (5)$$

$$LO3x(f) = \sum_{k=-\infty}^{\infty} \text{sinc}\left(\frac{k}{2}\right) * \delta(f - 3kf_{LO}), \qquad (6)$$

$$LO5x(f) = \sum_{k=-\infty}^{\infty} \text{sinc}\left(\frac{k}{2}\right) * \delta(f - 5kf_{LO}), \qquad (7)$$

$$LONx(f) = \sum_{k=-\infty}^{\infty} \text{sinc}\left(\frac{k}{2}\right) * \delta(f - Nkf_{LO}), \qquad (8)$$

where k is the set of all integers, f is the Fourier frequency variable and $f_{LO}$ is the local oscillator fundamental frequency.

Figure 3:
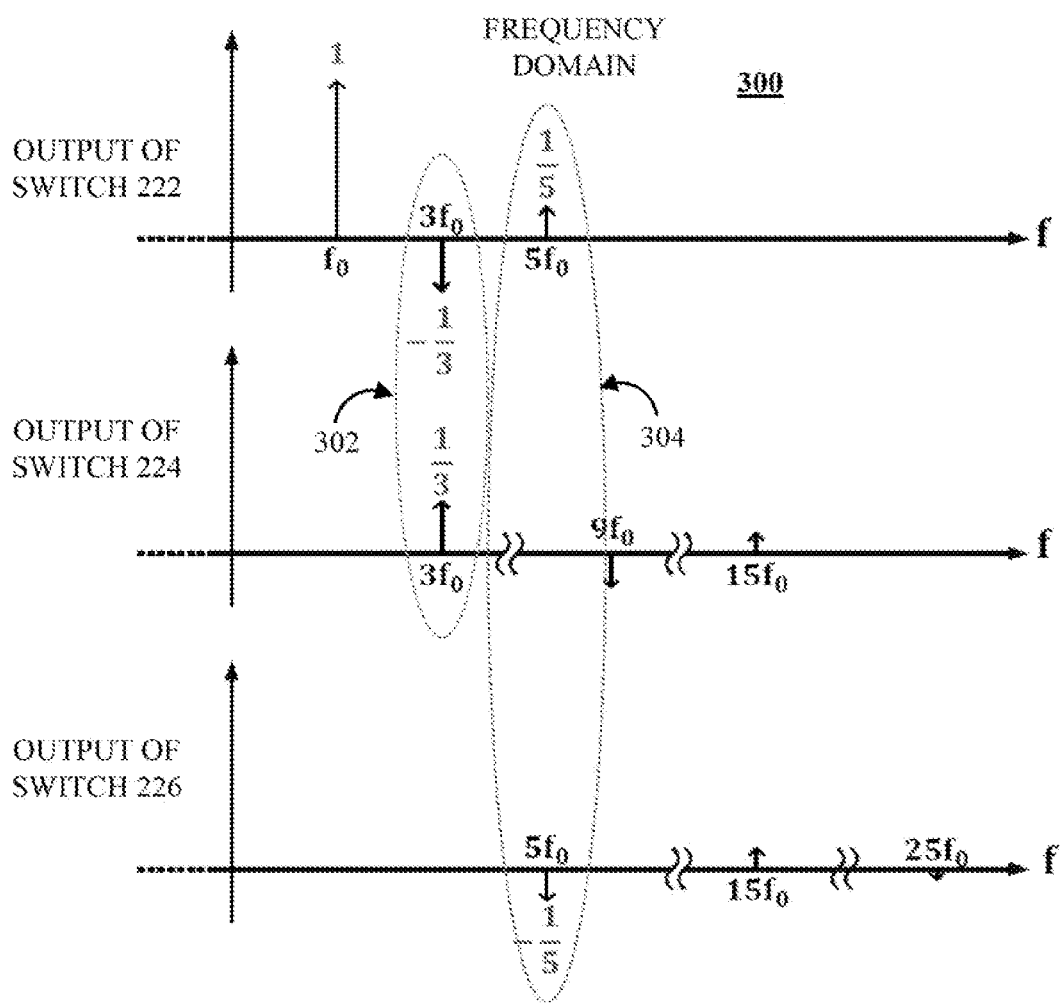
FIG. 3 shows an example of signals in the frequency domain that can be generated at a desired output frequency in various paths of the harmonic rejection mixer shown in FIG. 2 in accordance with some embodiments of the disclosed subject matter.

FIG. 3 shows an example 300 of frequency domain components that can be caused by mixing each of local oscillators LO1x, LO3x and LO5x with a DC input signal in the frequency domain. Note that the fundamental frequency of second local oscillator 234 and third local oscillator 236 are written in terms of multiples the fundamental frequency of local oscillator 232. As highlighted by region 302 in FIG. 3, an output from mixer 222 caused by the third harmonic of local oscillator 232 (e.g., LO1x) can be cancelled by an output from mixer 224 at the fundamental frequency of second local oscillator 234 (e.g., LO3x). Similarly, as highlighted by region 304 in FIG. 3, an output from mixer 222 caused by the fifth harmonic of local oscillator 232 (e.g., LO1x) can be cancelled by an output from mixer 226 at the fundamental frequency of second local oscillator 236 (e.g., LO5x). Note that the signals are shown as idealized signals in the frequency domain for clarity.

Figure 4:
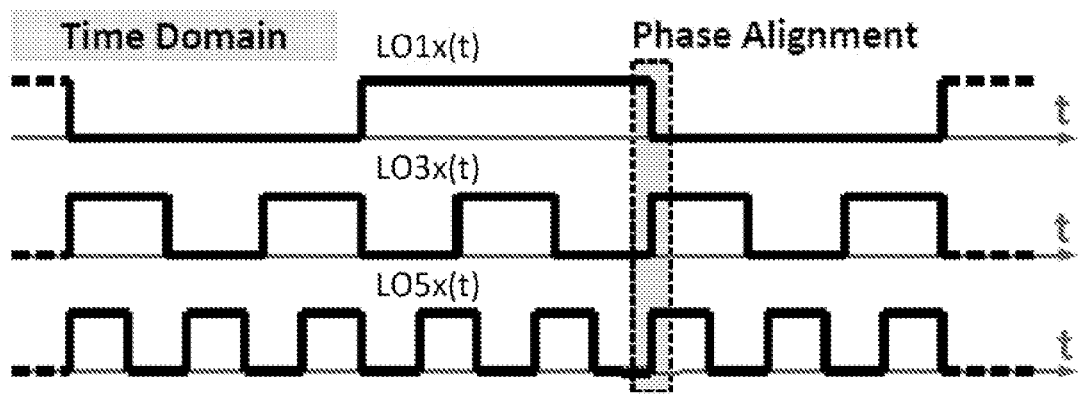
FIG. 4 shows an example of phase alignment of various local oscillators input to various switching mixers shown in the harmonic rejection mixer of FIG. 2 in accordance with some embodiments of the disclosed subject matter.

FIG. 4 shows an example 400 of a phase alignment of local oscillators signals LO1x, LO3x and LO5x for performing harmonic rejection of undesired signal components in the output signal. As shown in FIG. 4, in some embodiments, the falling edge of LO1x is aligned with a rising edge of LO3x and a rising edge of LO5x. Aligning edges of the local oscillators as shown in FIG. 4 can result in more complete cancellation of the undesired components of the output signal. On the other hand, a misalignment of one or more of the phases can result in less than complete cancellation and a reduction of the harmonic rejection ratio of harmonic rejection mixer 200.

Figure 5:
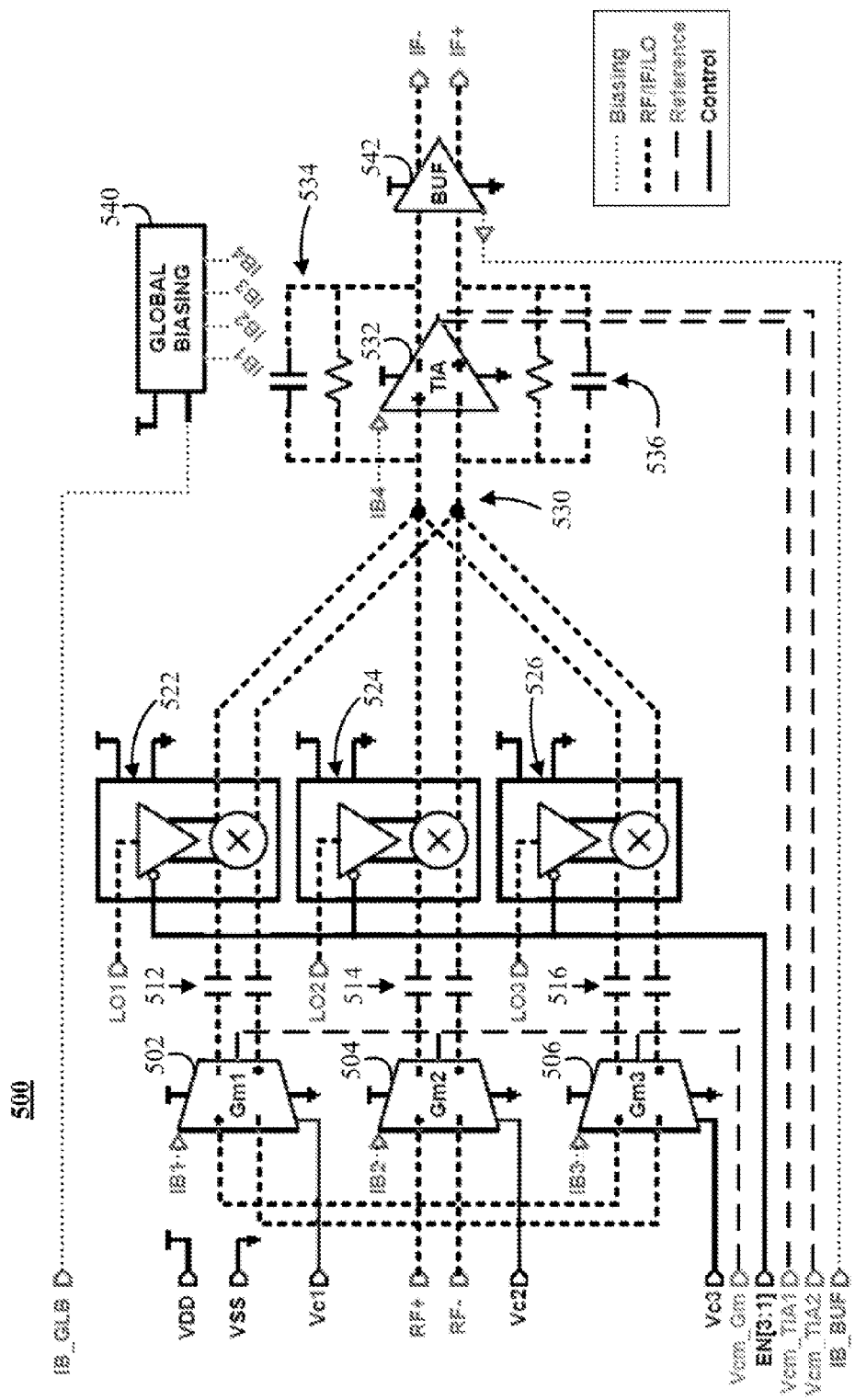
FIG. 5 shows an example of a schematic diagram of a reconfigurable harmonic rejection mixer in accordance with some embodiments of the disclosed subject matter.

FIG. 5 shows an example 500 of a schematic diagram of a reconfigurable harmonic rejection mixer that incorporates transconductors and a transimpedance amplifier in accordance with some embodiments of the disclosed subject matter. As shown in FIG. 5, harmonic rejection mixer 500 can include a main path and two auxiliary paths. The main path can include a first variable gain transconductor 502, first coupling capacitors 512, and a first switching mixer 522. A first auxiliary path can include a second variable gain transconductor 504, second coupling capacitors 514, and a second switching mixer 524. A second auxiliary path can include a third variable gain transconductor 506, third coupling capacitors 516, and a third switching mixer 526. Note that variable gain transconductors 502-506 are also referred to as transconductors 502-506. These three paths correspond to paths 202-206, respectively, as shown in FIG. 2. In some embodiments, HRM 500 can perform similar functions to those described above in connection with FIG. 2. For example, one or more undesired signals created by mixing a local oscillator with a signal on the main path at switching mixer 522 can be cancelled by signals created by switching mixer 524 on the first auxiliary path and by switching mixer 526 on the second auxiliary path.

In some embodiments, an input to transconductors 502-506 can include a differential voltage signal (RF+ and RF−). This differential voltage signal can be an input to each of transconductors 502-506 and can be converted to a current signal having a frequency that is equal to the frequency of the RF input signal, and an amplitude that is proportional to the amplitude of the input RF signal. The relationship between the amplitude of the voltage signal and the amplitude of the current signal can be related by the transconductance of the transconductor converting the voltage to a current (e.g., as described below in connection with FIG. 7).

In some embodiments, each transconductor 502-506 can receive an external common mode reference voltage Vcm_Gm for controlling a desired common mode voltage of the transconductor. For example, Vcm_Gm can control a common mode voltage of the transconductor as an input to a common mode feedback stage of the transconductor (e.g., as described below in connection with FIG. 7).

In some embodiments, each transconductor 502-506 can receive a bias current IB1-IB3, respectively. One or more bias currents and voltages for transistors in the transconductors 502-506 can be derived from bias current IB1-IB3, respectively, which are discussed below in connection with FIGS. 7 and 14.

In some embodiments, each transconductor 502-506 can receive a control voltage Vc1-Vc3, respectively. These control voltages can be used to control an effective transconductance of variable gain transconductors 502-506. Control voltages Vc1-Vc3 are described below in connection with FIGS. 7 and 8.

As described above in connection with FIGS. 1A and 2, the effective transconductance of the variable gain transconductors 502-506 can be set such that the ratio of the effective transconductances of 502 to 504 to 506 is 1:1/3:1/5, respectively (e.g., 15:5:3).

In some embodiments, coupling capacitors 512-516 can be AC-coupling capacitors placed between each of transconductors 502-506 and switching mixers 522-526, respectively. Coupling capacitors 512-516 can inhibit a DC component of the output of transconductors 502-506 from being passed to an input of switching mixers 522-526, respectively. The capacitance of coupling capacitors 512-516 can be sized with a ratio of 15:5:3, respectively, to facilitate matching with the gain of transconductors 502-506, which can increase the harmonic rejection ratio achieved by harmonic rejection mixer 500, in some cases. For example, capacitances of coupling capacitors 512-516 can be on the order of picofarads (pF). In a more particular example, coupling capacitors 512 can be set at about 12 pF each. As described above, coupling capacitors 514 and 516 can have capacitances that are one-third and one-fifth, respectively, of the capacitance of coupling capacitor 512. For example, if the capacitance of coupling capacitors 512 is about 12 pF, the capacitance of coupling capacitors 514 can be about 4 pF, and the capacitance of coupling capacitor 516 can be about 2.4 pF.

In some embodiments, switching mixers 522-526 can include passive mixers that each take an output from one of transconductors 502-506, respectively, and a local oscillator buffer. The local oscillator buffer can receive a local oscillator signal (e.g., LO1x, LO3x, etc.), and can output a signal for driving the passive mixers included in switching mixers 522-526, respectively. For example, a local oscillator signal LO1 input to switching mixer 522 can be a local oscillator signal such as LO1x described above in connection with FIGS. 2-4. As another example, a local oscillator signal LO2 input to switching mixer 524 can be a local oscillator signal at a third harmonic of LO1, such as LO3x described above in connection with FIGS. 2-4. As yet another example, a local oscillator signal LO3 input to switching mixer 526 can be a local oscillator signal at a fifth harmonic of LO1, such as LO5x described above in connection with FIGS. 2-4. In some embodiments, an enable signal can selectively enable or disable each of switching mixer 522-526 by activating or deactivating the local oscillator buffer. Switching mixers 522-526 are described below in connection with FIGS. 15-17.

In some embodiments, harmonic rejection mixer 500 can include nodes 530 that connect the main path with the auxiliary paths, which results in the outputs from switches 522-526 being combined. For example, the current signal output from switch 522 can be combined with the current signals output from switches 524 and 526. This can result in undesired signal components present in the output of switch 522 being cancelled (e.g., rejected) by combining with the signals generated at switches 524 and 526 at nodes 530.

In some embodiments, harmonic rejection mixer 500 can include a transimpedance amplifier (TIA) that is realized using an operational trancondtance amplifier (OTA) 532. The transimpedance amplifier can convert the current signal at nodes 530 to a voltage signal with substantially the same frequency and with a voltage that is proportional to the current of the signal at node 530. This can yield a voltage signal at the desired intermediate frequency (e.g., IF) in which undesired components generated by the harmonics of the local oscillator are substantially reduced and/or cancelled.

In some embodiments, OTA 532 can receive external common mode reference voltages Vcm_TIA1 and Vcm_TIA2 for controlling desired common mode voltages of the transimpedance amplifier. For example, Vcm_TIA1 and Vcm_TIA2 can control common mode voltages of the transimpedance amplifier as inputs to a common mode feedback stage of the transconductor to be used at an amplifier stage of the OTA (e.g., as described below in connection with FIG. 18).

In some embodiments, OTA 532 can receive a bias current IB4. Bias current IB4 can control an operating range of OTA 532 to maintain linear operation over a range of input currents. IB4 is also discussed below in connection with FIGS. 14 and 18.

In some embodiments, output ports of OTA 532 can be coupled to the input ports of OTA 532 with feedback circuitry to realize a transimpedance amplifier. For example, a negative output port of OTA 532 can be connected to the positive input port of OTA 532 across a feedback path that includes a first feedback capacitance and a first feedback resistance 534. As another example, a positive output port of OTA 532 can be connected to the negative input port of OTA 532 across a feedback path that includes a first feedback capacitance and a first feedback resistance 536. In a more particular example, the capacitances and resistances of feedback circuits 534 and 536 can be 1 pF and 1 kΩ, respectively. In another more particular example, the capacitances and resistances of feedback circuits 534 and 536 can be 1 femtofarad (fF) and 10 kΩ, respectively. Note that these are merely given as examples, and any suitable values can be used. In some embodiments, the feedback capacitances and resistances can be based on a desired operational bandwidth of the harmonic rejection mixer.

In some embodiments, harmonic rejection mixer 500 can include a global biasing circuit 540 that receives a global biasing current IB_GLB and generates biasing currents IB1-IB4. A more particular example of global biasing circuit 540 is described below in connection with FIG. 14.

In some embodiments, harmonic rejection mixer 500 can include an output buffer 542 to set an output resistance of harmonic rejection mixer 500 to a resistance that matches a system in which harmonic rejection mixer 500 is being used. For example, if harmonic rejection mixer 500 is used as an input to a component that has an input impedance of 50 ohms (Ω), output buffer 542 can have an output resistance of 50Ω to reduce reflections and/or loss of signal to noise ratio caused by transmission of the output signal to the next component. Output buffer 542 can be configured to have any suitable output resistance by selecting the values of components used to construct output buffer 542. Additionally, output buffer 542 can receive a bias current IB_BUF for controlling an operating point of the output buffer. For example, IB_BUF can have a value on the order of about 50 μA.

Figure 6:
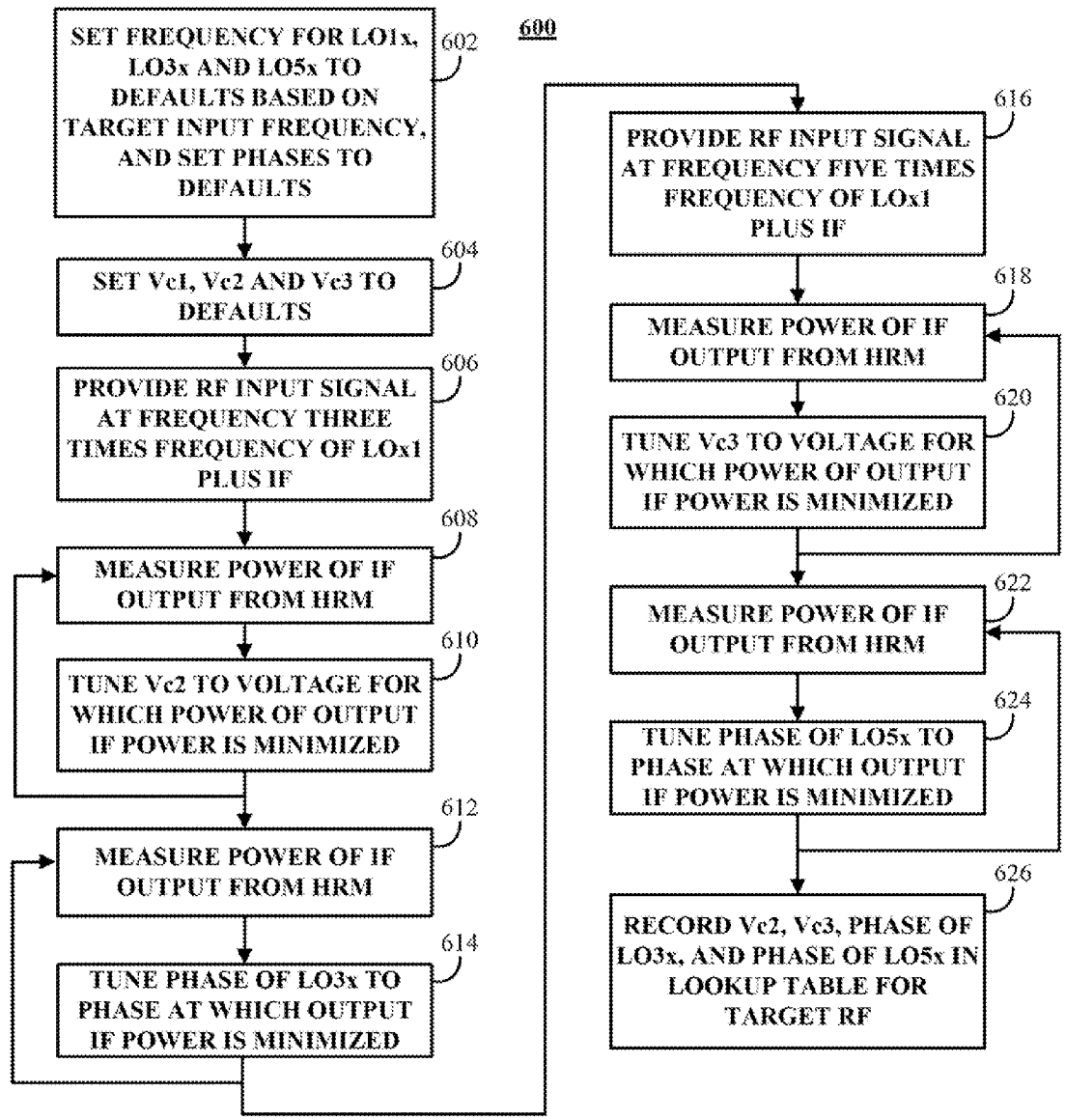
FIG. 6 shows an example of a process for tuning a reconfigurable harmonic rejection mixer in accordance with some embodiments of the disclosed subject matter.

FIG. 6 shows an example 600 of a process for tuning parameters of a harmonic rejection mixer in accordance with some embodiments of the disclosed subject matter. For example, process 600 can be used to tune parameters of harmonic rejection mixer 500 to achieve a higher harmonic rejection ratio for signals at the third harmonic and/or the fifth harmonic. Note that, although process 600 is described as being used in connection with harmonic rejection mixer 500, process 600 can be used in connection with any suitable harmonic rejection mixer using the mechanisms described herein. For example, if a third auxiliary path is used to account for the seventh harmonic of the local oscillator signal, process 600 can be altered to also tune parameters for the third auxiliary path.

In some embodiments, at 602, process 600 can set the frequency of the local oscillator for the main path (e.g., LO1x) based on the target input frequency and the desired intermediate frequency, and can set the frequency of the local oscillator for the auxiliary paths (e.g., LO3x and LO5x) based on the frequency of the local oscillator for the main path. For example, if the target input frequency is 1 GHz and the desired intermediate frequency is 50 MHz, the local oscillator for the main path (e.g., LO1x) can be set to 1050 MHz (e.g., 1 GHz plus 50 MHz, or 1.05 GHz). The local oscillator signals for the second path (e.g., LO3x) and third path (e.g., LO5x) can be set to the third harmonic and fifth harmonic, respectively, of the local oscillator for the main path. Continuing the previous example, LO3x can be set to 3150 MHz, and LO5x can be set to 5250 MHz. Additionally, in some embodiments, at 602, a timing of the a rising or falling edge of the local oscillator signals for the various paths can be set to default values.

At 604, process 600 can set values for the control voltages Vc1-Vc3 for the transconductors (e.g., transconductors 502-506) to default values. For example, Vc1 can be set to provide a unity gain on the main path (e.g., an effective transconductance of one), while Vc2 and Vc3 can be set to provide a gain of one-third and one-fifth, respectively. Although gains of one, one-third and one-fifth are described, the amplifiers (e.g., transconductors 502-506) can be set to any suitable values.

At 606, process 600 can provide an RF test signal at the input of the harmonic rejection mixer (e.g., HRM 500) to test the harmonic rejection ratio of the third harmonic component of the output signal. For example, the RF test signal can be a test tone with a frequency that is the third harmonic of the local oscillator for the main path (e.g., LO3x) plus or minus the local oscillator frequency. In the example above, where the target input frequency is 1 GHz, the test signal at 606 can have a frequency of 3140 MHz and/or 3160 MHz. Additionally, an input of the HRM can be shielded and/or preconditioning circuitry can be used such that the RF test signal is the only signal input into the HRM.

At 608, process 600 can measure a power of the output signal at the desired intermediate frequency (IF). This power can represent the difference between the output in the IF signal caused by the third harmonic of the local oscillator in the main path (e.g., caused by the third harmonic of LO1x), and the output in the IF signal caused by the fundamental of the local oscillator in the first auxiliary path (e.g., LO3x).

At 610, process 600 can change the control voltage (e.g., Vc2) for controlling the transconductor on the first auxiliary path (e.g., transconductor 504) to a value that causes the power of the intermediate frequency to decrease. For example, after changing Vc2 to a new value, process 600 can return to 608 and measure the power of the IF signal and determine whether the power has increased or decreased. If the power increases, process 600 can cause the control voltage to be changed in the other direction. If the power increases moving in either direction, process 600 can determine that the previous control voltage is a control voltage that minimizes power of the IF signal.

At 612, process 600 can measure a power of the output signal at the desired intermediate frequency (IF) using a similar process to that used to measure power of the IF at 608. Note that in some embodiments, if the power is known (e.g., was measured at 608 and no changes have been made to parameters), process 600 can skip 612.

At 614, process 600 can change the phase of the local oscillator for the first auxiliary path (e.g., the phase of LO3x) to a value that causes the power of the intermediate frequency to decrease. For example, after changing the phase of LO3x to a new value, process 600 can return to 612 and measure the power of the IF signal and determine whether the power has increased or decreased. If the power increases, process 600 can cause the phase to be changed in the other direction. If the power increases moving in either direction, process 600 can determine that the previous phase is a phase that minimizes power of the IF signal.

At 616, process 600 can provide an RF test signal at the input of the harmonic rejection mixer (e.g., HRM 500) to test the harmonic rejection ratio of the fifth harmonic component of the output signal. For example, the RF test signal can be a test tone with a frequency that is the fifth harmonic of the local oscillator for the main path (e.g., LO5x) plus or minus the local oscillator frequency. In the example above, where the target input frequency is 1 GHz, the test signal at 616 can have a frequency of 5240 MHz and/or 5260 MHz.

At 618, process 600 can measure a power of the output signal at the desired intermediate frequency (IF). This power can represent the difference between the output in the IF signal caused by the fifth harmonic of the local oscillator in the main path (e.g., caused by the fifth harmonic of LO1x), and the output in the IF signal caused by the fundamental of the local oscillator in the second auxiliary path (e.g., LO5x).

At 620, process 600 can change the control voltage (e.g., Vc3) for controlling the transconductor on the second auxiliary path (e.g., transconductor 506) to a value that causes the power of the intermediate frequency to decrease. For example, after changing Vc3 to a new value, process 600 can return to 618 and measure the power of the IF signal and determine whether the power has increased or decreased. If the power increases, process 600 can cause the control voltage to be changed in the other direction. If the power increases moving in either direction, process 600 can determine that the previous control voltage is a control voltage that minimizes power of the IF signal.

At 622, process 600 can measure a power of the output signal at the desired intermediate frequency (IF) using a similar process to that used to measure power of the IF at 618. Note that in some embodiments, if the power is known (e.g., was measured at 618 and no changes have been made to parameters), process 600 can skip 622.

At 624, process 600 can change the phase of the local oscillator for the second auxiliary path (e.g., the phase of LO5x) to a value that causes the power of the intermediate frequency to decrease. For example, after changing the phase of LO5x to a new value, process 600 can return to 622 and measure the power of the IF signal and determine whether the power has increased or decreased. If the power increases, process 600 can cause the phase to be changed in the other direction. If the power increases moving in either direction, process 600 can determine that the previous phase is a phase that minimizes power of the IF signal.

At 626, the values set for the parameters tuned at 610, 614, 620, and 624 can be recorded in a lookup table that includes parameters for various target RF input frequencies and corresponding desired intermediate frequencies. For example, the values for Vc2, Vc3, the phase of LO3x and the phase of LO5x can be recorded in an entry that corresponds to the target input frequency and desired intermediate frequency. In some embodiments, the values stored in the lookup table can be with reference to the values of the control voltage for the main path, and the phase of the local oscillator of the main path. For example, values for Vc2 and Vc3 can be stored as a percentage of the value used for Vc1 to any suitable degree of precision. As another example, values for the phase LO3x and the phase of LO5x can be stored as a number of degrees that the phase is different (e.g., plus or minus) from the phase of LO1x to any suitable degree of precision.

In some embodiments, process 600 can run multiple times to refine the values for the parameters set using process 600. For example, after determining parameters for the first auxiliary path and the second auxiliary path, process 600 can return to 606-614 to refine the values for the first auxiliary path, and so on, until a change in the parameters between runs is below a threshold. In some embodiments, any suitable equipment can be used to execute process 600. For example, a computer (e.g., a personal computer, a laptop computer, etc.) can control a signal generator for generating a test signal, can cause control voltages to be generated for controlling transconductance of transconductors in the harmonic rejection mixer and controlling a phase of the local oscillators, and can cause a power of the output signal to be determined. Such a computer can run process 600 for various target input frequencies to build a lookup table that can be used during operation of the harmonic rejection mixer.

In some embodiments, process 600 can be adapted to be used for any number of auxiliary paths used in a harmonic rejection mixer. For example, if a third auxiliary path is added for the seventh harmonic of the local oscillator signal, process 600 can be adjusted to incorporate any suitable steps for determining a control voltage and/or phase offset for the third auxiliary path. As another example, if auxiliary paths are added to reject signals caused by even harmonics of the local oscillator (e.g., in an example where the local oscillator signal includes even harmonics), process 600 can be adjusted to incorporate any suitable steps for determining control voltages and/or phase offsets for these auxiliary paths.

It should be understood that the above described steps of the processes of FIG. 6 can be executed or performed in any order or sequence not limited to the order and sequence shown and described in the figures. Also, some of the above steps of the processes of FIG. 6 can be executed or performed substantially simultaneously where appropriate or in parallel to reduce latency and processing times.

Figure 7:
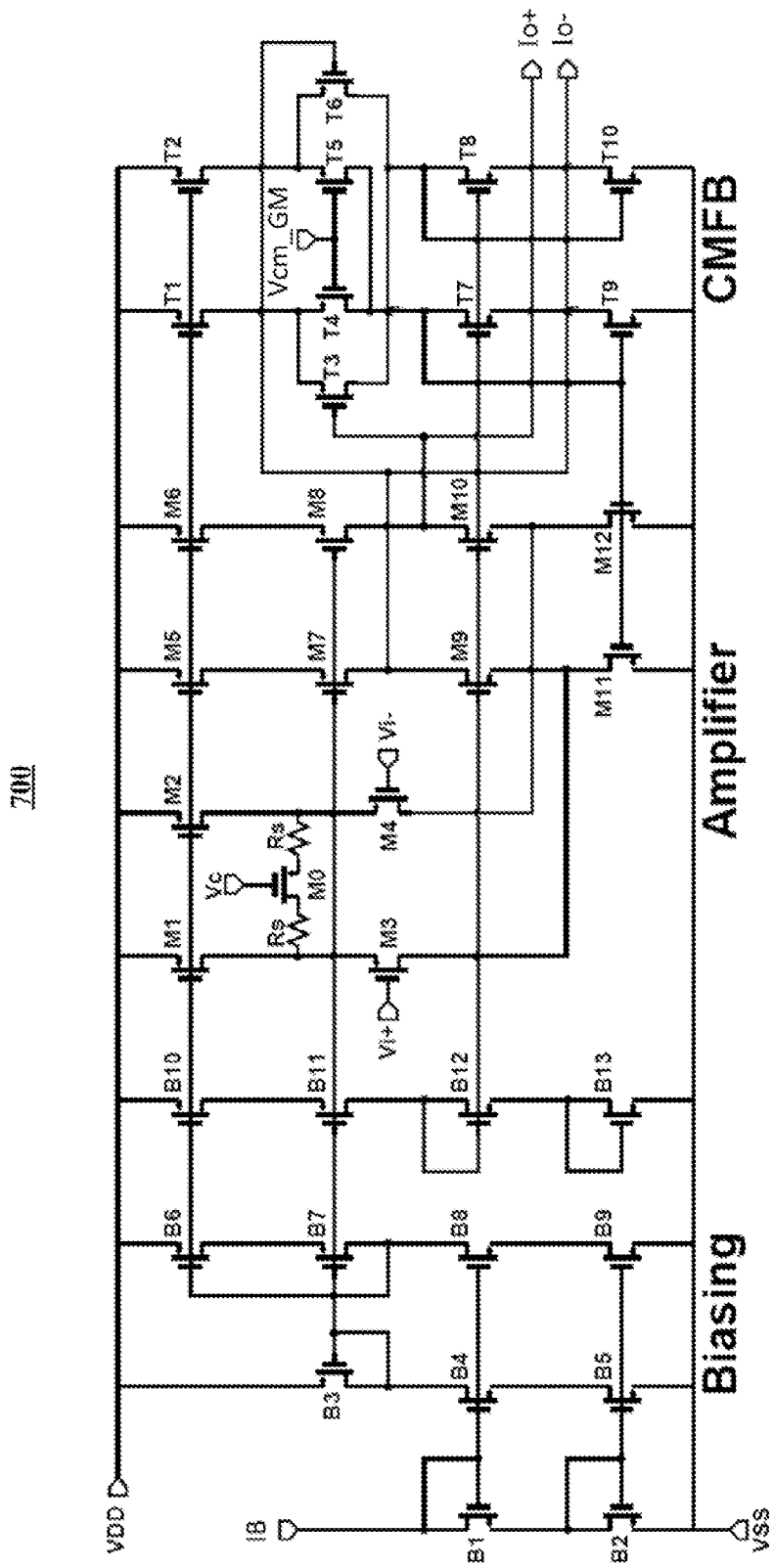
FIG. 7 shows an example of a transconductor that can be used in a reconfigurable harmonic rejection mixer in accordance with some embodiments of the disclosed subject matter.

FIG. 7 shows an example 700 of a schematic diagram of a variable gain transconductor that can be used in accordance with some embodiments of the disclosed subject matter. For example, variable gain transconductor 700 can be used as transconductors 502-506 by adjusting the components used to construct variable gain transconductor 700 to provide a desired trans conductance.

As shown in FIG. 7, variable gain transconductor 700 can include a biasing stage (e.g., including transistors B1-B13), an amplifier stage (e.g., including transistors M0-M12, and voltage controlled degenerative resistors Rs), and a common mode feedback stage (e.g., including transistors T1-T10).

In some embodiments, the biasing stage can receive a biasing current (e.g., biasing current IB1, IB2, etc.) as shown in FIG. 7, which can control the operating point of the amplifying stage. For example, a biasing current of 200 microamperes (µA) can be provided to the biasing stage.

In some embodiments, the amplifier stage can receive voltage inputs Vi+ and Vi- at the gates of transistors M3 and M4 respectively, which can be differential signals of an RF input signal (e.g., RF+ and RF- shown in FIG. 5). Additionally, the amplifier stage can receive a control voltage Vc at the gate of transistor M0 for controlling the resistance of voltage controlled degenerative resistors Rs.

The amplifier stage can convert the input voltage signals (e.g., Vi+ and Vi-) to output current signals (Io+ and Io-) with an amplitude that is proportional to the amplitude of the input voltage. The ratio of the input voltage to the output can be based on the effective transconductance (Gm) of the transconductor, which is based on the transconductance (gm) of the transconductor, the output impedance of the transconductor and the load impedance of a load coupled to the transconductor in accordance with.

$$G_m = \frac{Z_{out}}{Z_{out} + Z_{load}} * g_m. \tag{9}$$

In some embodiments, the effective transconductance (Gm) of a transconductor used in the mechanisms described herein can be based on at least the transconductance (gm) of the transconductor, the output resistance of the transconductor, the AC coupling capacitance between the transconductor and the switching mixer, the ON-resistance of the switches in the signal path in which the transconductor is located, and the input impedance of a current to voltage converter coupled to the transconductors output. With reference to FIG. 5, the effective transconductance of transconductor 502 is based on the output resistance of transconductor 502, the capacitance of AC coupling capacitors 512, the ON-resistance of switching mixer 522, and the input impedance of OTA 532. Using these components as an example, the theoretical effective transconductance (Gm) of transconductor 502 can be expressed using a more particular example of equation (9), which can be expressed using the following:

$$G_{m502} = \frac{R_{o502}}{R_{o502} + R_{ON522} + j\left(\frac{1}{wC_{512}}\right) + R_{IN532}} * gm_{502}. \quad (10)$$

In some embodiments, the effective transconductance of transconductors 504 and 506 can be described using equation (10) by substituting the appropriate values that correspond to transconductors 504 and 506. As described above in connection with FIG. 5, the ratio of the effective transconductance of the three transconductors can be set to be 1:1/3:1/5, respectively (e.g., 15:5:3).

In some embodiments, the values used for various components can be set based on this ratio. For example, components used to make transconductors 502-506 can be chosen to set the transconductance (gm) of transconductors 502-506 to be 1*gm_502: 1/3*gm_502:1/5*gm_502, respectively. As another example, capacitive elements used to make coupling capacitors 512-516 can be chosen to set the capacitance of coupling capacitors 512-516 to be 15*C_0:30:5*C_0:3*C_0, where C_0 can be any suitable value for providing an appropriate coupling capacitance between transconductors 502-506 and switching mixers 522-526, respectively. For example, C_0 can be 800 fF. As yet another example, components used to make transconductors 502-506 can be chosen to set the output impedance (Ro) of transconductors 502-506 to be 1*Ro_502: 3*Ro_502:5*Ro_502, respectively. As still another example, components used to make switching mixers 522-526 can be chosen to set the ON-impedance (R_ON) of switching mixers 522-526 to be 1*R_ON 522:3*R_ON 522:5*R_ON 522, respectively.

In some embodiments, a relatively high output impedance (e.g., Ro) can be used in transconductors 502-506 to cause the transconductance to be relatively stable with respect to changes in the properties of other components caused by changes in temperature, input frequencies, or any other internal or external factors affecting components of the harmonic rejection mixer. In some embodiments, components used to make transconductors 502-506 can be chosen to set the output resistance (Ro) of transconductors 502-506 to be about 7.6 kΩ, 23 kΩ, and 37.6 kΩ, respectively. For example, components with values according to Table 1 can be used to make transconductors 502-506. In some embodiments, for example, as shown in Table 1, scaling of transconductance (gm) and output resistance (Ro) can be achieved by sizing the transistors used in constructing the transconductances.

TABLE 1

Transistors Properties for Transconductors 502-506 in some embodiments

| Transistor | Type | Size (Fingers) | $I_D$ (μA) | $g_m$ (mS) | $g_{ds}$ (μS) | Remark |
|---|---|---|---|---|---|---|
| B1 | N | 60 | 200 | 3 | 275 | Biasing |
| B2 | N | 60 | 200 | 3 | 275 | — |
| B3 | P | 6 | 196 | 1.1 | 123 | — |
| B4 | N | 60 | 196 | 3 | 306 | — |
| B5 | N | 60 | 196 | 3 | 274 | — |
| B6 | P | 60 | 205 | 2.8 | 481 | — |
| B7 | P | 60 | 205 | 2.8 | 487 | — |
| B8 | N | 60 | 205 | 3 | 261 | — |
| B9 | N | 60 | 205 | 3 | 277 | — |
| B10 | P | 60 | 211 | 3 | 472 | — |
| B11 | P | 60 | 211 | 3 | 396 | — |
| B12 | N | 60 | 211 | 3.2 | 256 | — |
| B13 | N | 60 | 211 | 3.2 | 256 | — |
| M1 M2 | P | 180/60/36 | 630/210/126 | 8.7/2.9/1.7 | 1420/475/285 | AMP |
| M3 M4 | P | 180/60/36 | 630/210/126 | 9/3/1.8 | 880/293/176 | — |
| M5 M6 | P | 60/20/12 | 214/71/43 | 3/1/0.6 | 469/156/94 | — |
| M7 M8 | P | 60/20/12 | 214/71/43 | 3/1/0.6 | 372/124/75 | — |
| M9 M10 | N | 60/20/12 | 214/71/43 | 3.2/1.1/0.64 | 306/102/61 | — |
| M11 M12 | N | 240/80/48 | 844/281/169 | 12.6/4.2/2.5 | 1160/386/232 | — |
| T1 T2 | P | 20 | 73 | 1 | 155 | CMFB |
| T3 T4 T5 T6 | P | 30 | 36.5 | 0.62 | 92 | — |
| T7 T8 | N | 20 | 73 | 1.1 | 95 | — |
| T9 T10 | N | 20 | 73 | 1.1 | 99 | — |

In table 1, "transistor" refers to the label of the transistor in FIG. 7, "type" refers to NMOS (N) or PMOS (P), "size" is given in fingers (e.g., a number of individual transistors used to make a transistor that is capable of handling more powerful signals), drain current ("$I_D$") is given in microamperes (μA), transconductance of the transistor ("$g_m$") is given in millisiemens (mS), and the drain-source transconductance ("$g_{ds}$") of the transistor is given in microsiemens (μS). As shown in table 1, numbers in cells separated by the symbol "/" can represent values for different paths in the HRM. For example, "180/60/36" can represent values of 180 for the main path, 60 for the first auxiliary path, and 36 for the second auxiliary path.

As shown in table 1, the bias stage and the common mode feedback stage can be substantially the same in each of transconductors 502-506. However, components for the amplifier stage can be scaled in each of transconductors 502-506. For example, transistors M1 and M2 in transconductor 502 can be sized at 180 fingers, while these transistors can be sized at 60 fingers in transconductor 504 and 36 fingers in transconductor 506. In some embodiments, transistors M0 in transconductors 502/504/506 can be sized at 60/20/12 fingers having a minimum channel width of about 152 nanometers (nm) and a minimum channel length of about forty nanometers (nm) for each finger. Additionally, resistors Rs in transconductors 502/504/506 can have values of 150/450/750 ohms. More generally, the size of transistors in transconductors 502-506 can be scaled by the ratio 15:5:3, respectively. Although specific values are shown for the transistors of transconductors 502-506, this is merely an example, and any suitable values can be used in making transconductors 502-506.

Figure 8:
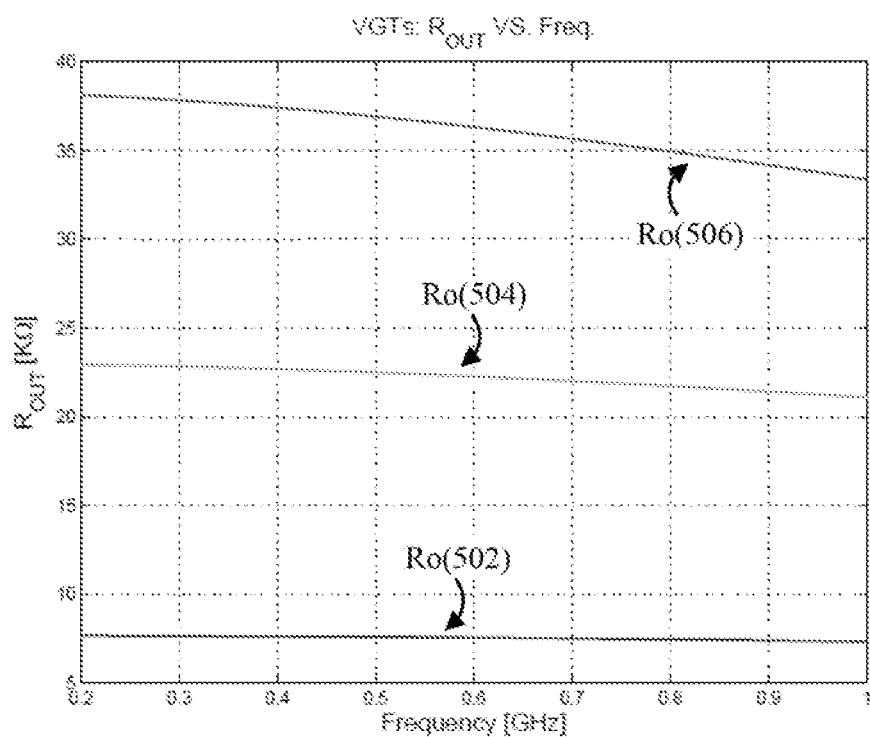
FIG. 8 shows an example of output impedances of transconductors described in connection with FIGS. 5 and 7 versus frequency that can be realized in accordance with some embodiments of the disclosed subject matter.

FIG. 8 shows an example of the output impedance of each of transconductors 502-506 over the range of 200 MHz to 1 GHz that can be realized in accordance with some embodiments. Note that the output impedance changes as a function of frequency, and therefore the effective transconductance of each of transconductors 502-506 also varies according to frequency in accordance with equation (10).

Figure 9:
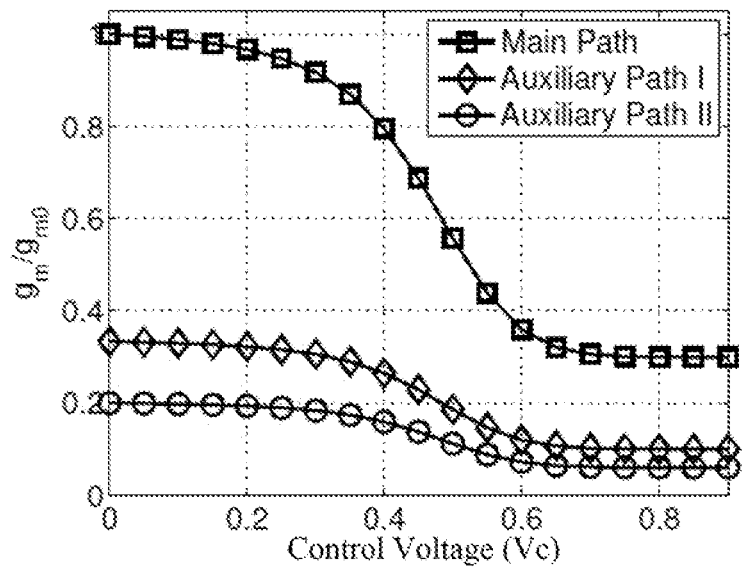
FIG. 9 shows an example of normalized transconductances of transconductors described in connection with FIGS. 5 and 7 versus control voltage that can be realized in accordance with some embodiments of the disclosed subject matter.

FIG. 9 shows an example of a ratio of transconductance ($g_m$) versus a normalized transconductance ($g_{m0}$) as a function of control voltage (e.g., Vc) for transconductors in the main path (e.g., transconductor 502) and the first and second auxiliary paths (e.g., transconductors 504 and 506) that can be realized in accordance with some embodiments. For example, using the parts shown in table 1, transconductance ($g_m$) can be normalized to three (3) microsiemens (mS). As described above, control voltages Vc1-Vc3 can be tuned to compensate for parameters that change with frequency (e.g., Ro shown in FIG. 8) to maintain a constant ratio of effective transconductance between transconductors 502-506.

Figure 11:
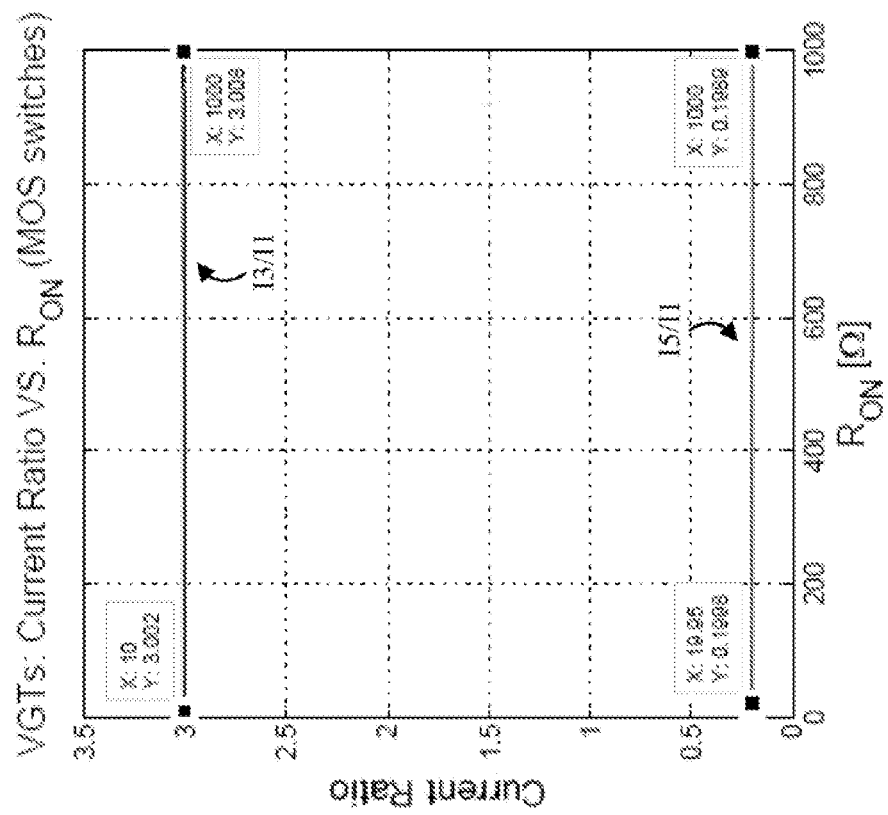
FIG. 11 shows an example of a current ratio of currents in various paths described in connection with FIG. 5 versus on-resistance of mixing switches described in connection with FIGS. 5 and 15 that can be realized in accordance with some embodiments of the disclosed subject matter.
Figure 10:
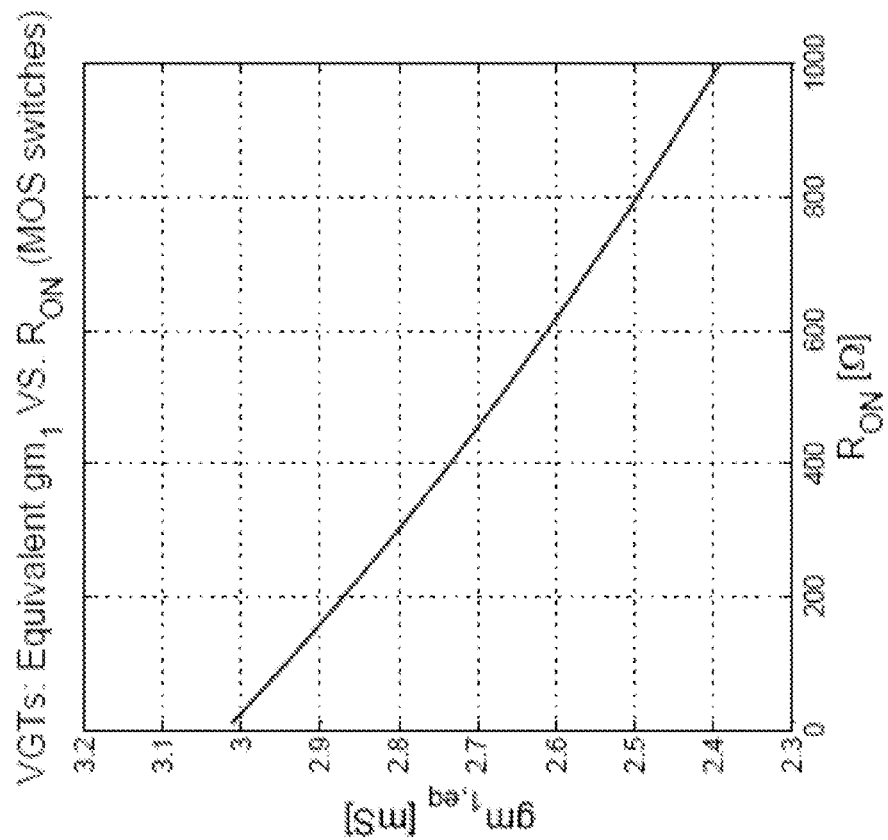
FIG. 10 shows an example of an effective transconductance of transconductors described in connection with FIGS. 5 and 7 versus an on-resistance of mixing switches described in connection with FIGS. 5 and 15 that can be realized in accordance with some embodiments of the disclosed subject matter.

FIG. 10 shows an example of effective transconductance of the transconductor in the main path (e.g., transconductor 502) versus the ON-resistance of the switching mixer in the main path (e.g., switching mixer 522) that can be realized in accordance with some embodiments. As shown, as the ON-resistance of the switching mixer increases, the effective transconductance of the transconductor decreases. FIG. 11 shows an example of the ratio of the currents output by transconductors 504 and 502 (e.g., I3/I1) and 506 and 502 (e.g., I5/I1), respectively, versus changes in the ON-resistance of the switching mixers that can be realized in accordance with some embodiments. As shown in FIG. 11, the current output at the transconductors can vary as a function of R_ON due to non-zero output conductance of the transconductors causing incomplete current flow to a next stage (e.g., mixers 522-526). Rather, the current flowing to the next stage can vary based on a ratio between R_ON and Ro.

Figure 13:
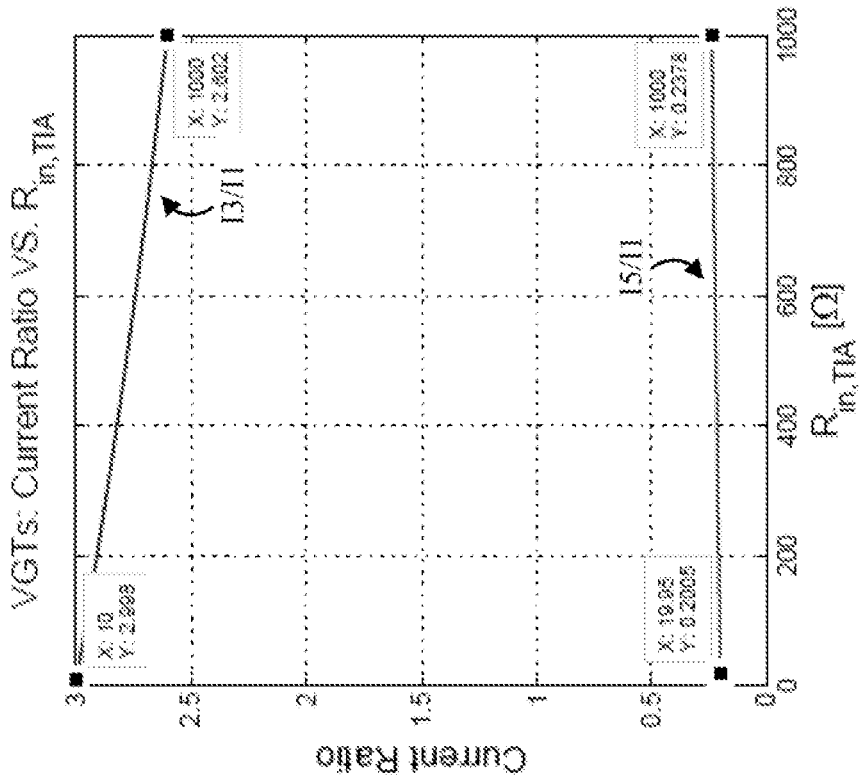
FIG. 13 shows an example of a current ratio of currents in various paths described in connection with FIG. 5 versus input impedance of a transimpedance amplifier described in connection with FIGS. 5 and 18 that can be realized in accordance with some embodiments of the disclosed subject matter.
Figure 12:
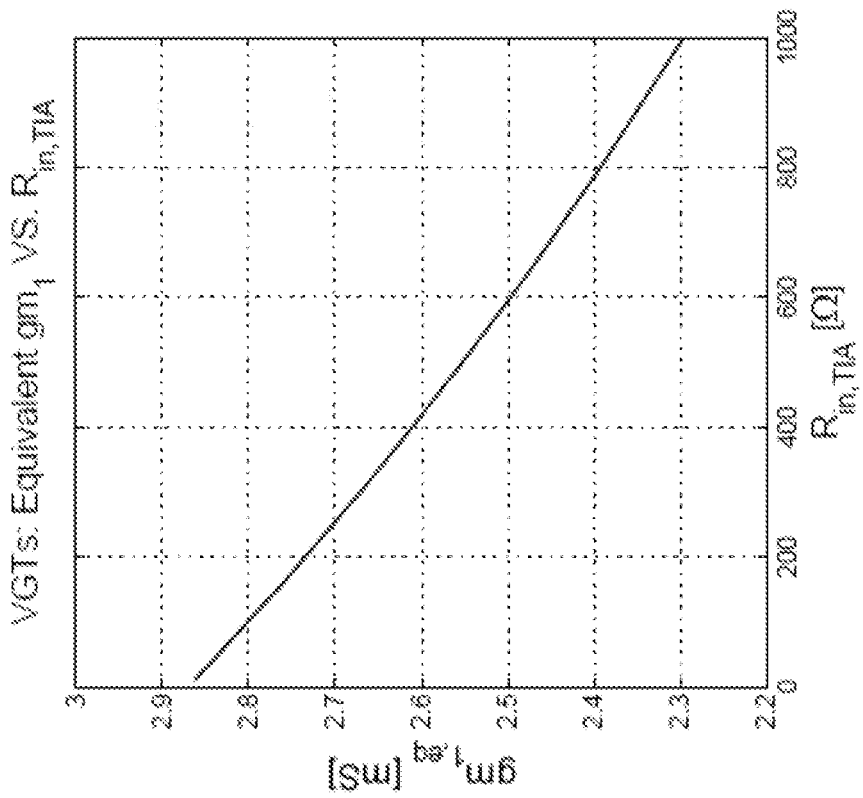
FIG. 12 shows an example of an effective transconductance of transconductors described in connection with FIGS. 5 and 7 versus an input impedance of a transimpedance amplifier described in connection with FIGS. 5 and 18 that can be realized in accordance with some embodiments of the disclosed subject matter.

FIG. 12 shows an example of effective transconductance of the transconductor in the main path (e.g., transconductor 502) versus the input impedance (Rin) of the transimpedance amplifier (e.g., OTA 532) that can be realized in accordance with some embodiments. As shown, as the input impedance of the transimpedance amplifier increases, the effective transconductance of the transconductor decreases. FIG. 13 shows an example of the ratio of the currents output by transconductors 504 and 502 (e.g., I3/I1) and 506 and 502 (e.g., I5/I1), respectively, versus changes in the ON-resistance of the switching mixers that can be realized in accordance with some embodiments.

Figure 14:
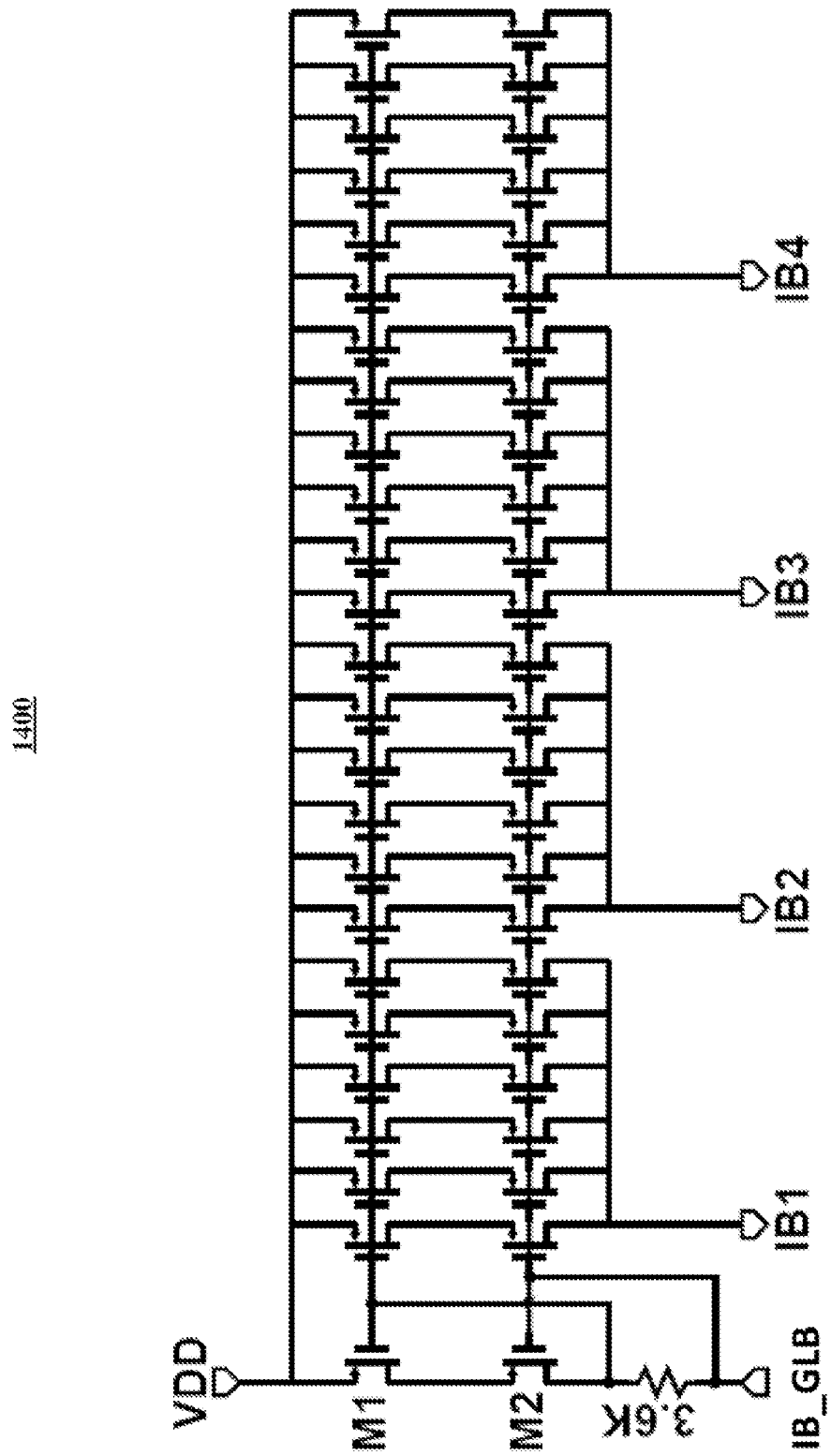
FIG. 14 shows an example of a schematic diagram of a global biasing circuit that can be used in a accordance with some embodiments of the disclosed subject matter.

FIG. 14 shows an example 1400 of a schematic diagram of a current bias generation circuit that can be used in accordance with some embodiments of the disclosed subject matter. For example, current bias generating circuit 1400 can be used as global biasing circuit 508 to provide biasing currents IB1-IB4. In some embodiments, current bias generation circuit can receive a global biasing current IB_GLB, and output biasing currents IB1-IB4. In some embodiments, current bias generation circuit 1400 can include transistors M1 and M2, and cascode current mirrors for each biasing current to be output.

In some embodiments, biasing currents IB1-IB4 can be set at 200 μA for providing a biasing current to each transconductor 502-506 and OTA 532. If the global biasing current is received at 33 microamperes (μA), an overdrive voltage of transistors M1 and M2 can be 120 millivolts (mV), and the current across each of transistor M1 and M2 can be 33 microamperes (μA). In such an example, a resistance of 3.6 KΩ can be used.

In some embodiments, transistors M1, M2 and the unlabeled transistors can be PMOS transistors with a size of 10 fingers having a minimum channel width of 152 nanometers (nm) and a minimum channel length of forty nanometers (nm) for each finger. The cascode current mirrors (e.g., including the transistors not labeled in FIG. 14) can be implemented using any suitable technique or techniques. For example, the cascode current mirrors can be implemented using a complementary metal oxide semiconductor architecture, a silicon on insulator architecture, or any other suitable technology.

Figure 15:
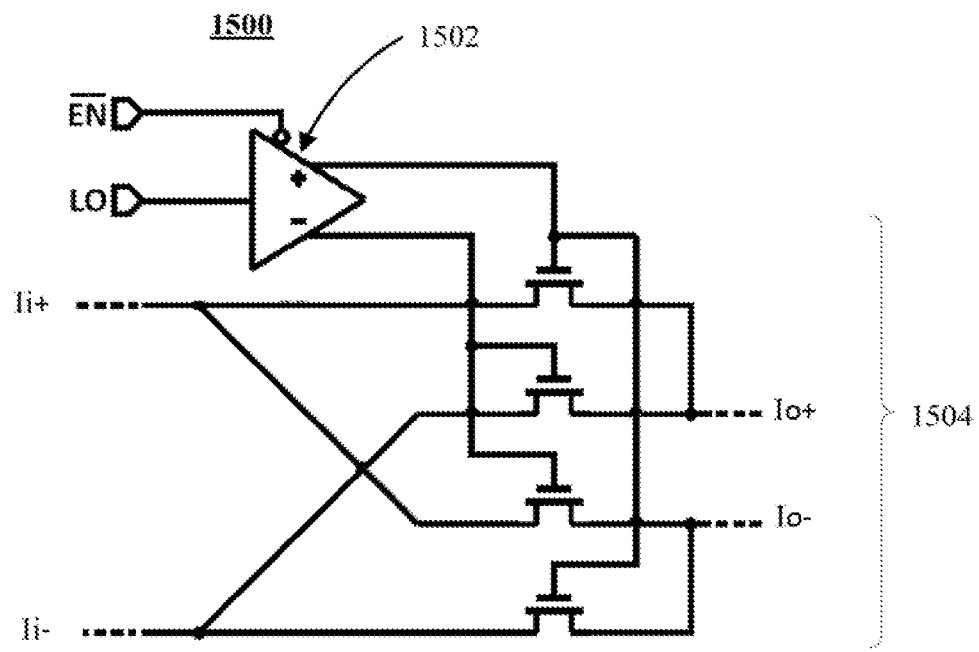
FIG. 15 shows an example of a schematic diagram of a switching mixer that can be used in accordance with some embodiments of the disclosed subject matter.

FIG. 15 shows an example 1500 of a schematic diagram of a switching mixer that can be used in accordance with some embodiments of the disclosed subject matter. For example, switching mixer 1500 can be used as switching mixers 522-526 to mix a local oscillator signal with a current signal (e.g., a current signal output by trans conductors 502-506). In some embodiments, switching mixer 1500 can include a local oscillator buffer 1502 and a metal oxide semiconductor (MOS) switch 1504. In some embodiments, components for the passive mixer can be scaled in each of switching mixers 522-526.

In some embodiments, local oscillator buffer 1502 can convert a local oscillator input (e.g., LO1x, LO3x, etc.) from a single-ended signal into a double-balanced local oscillator signal for driving the gates of MOS switch 1504.

Figure 16:
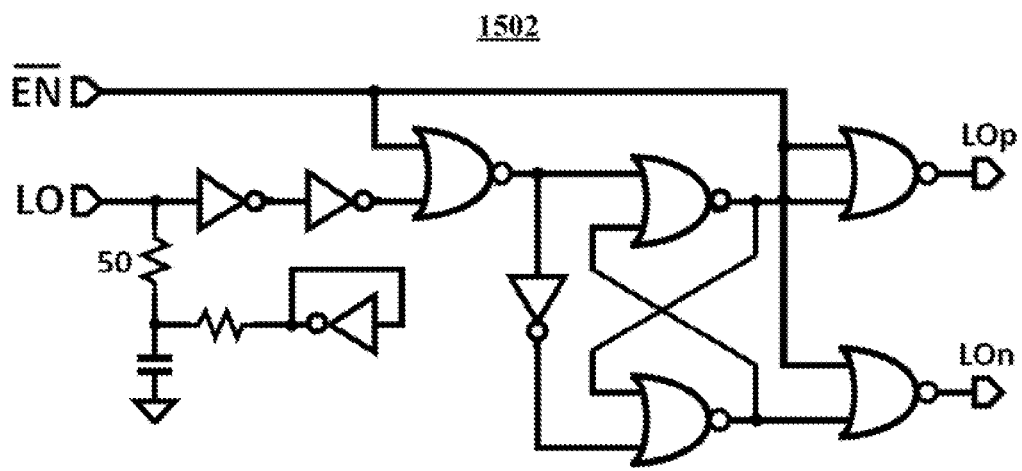
FIG. 16 shows an example of a schematic diagram of a local oscillator buffer that can be used in accordance with some embodiments of the disclosed subject matter.

FIG. 16 shows an example of a generalized schematic diagram of local oscillator buffer 1502 that can be used in accordance with some embodiments. As shown in FIG. 16, local oscillator buffer 1502 can be implemented using NOR gates and inverters. Additionally, an input impedance of local oscillator buffer 1502 can be set to approximately 50Ω.

In some embodiments, to obtain a double balanced local oscillator signal with a 50% duty cycle from the input local oscillator signal, NMOS and PMOS transistors can be sized with a ratio of 16:10 to set a switching point of the CMOS inverters to about 0.5V.

Figure 17:
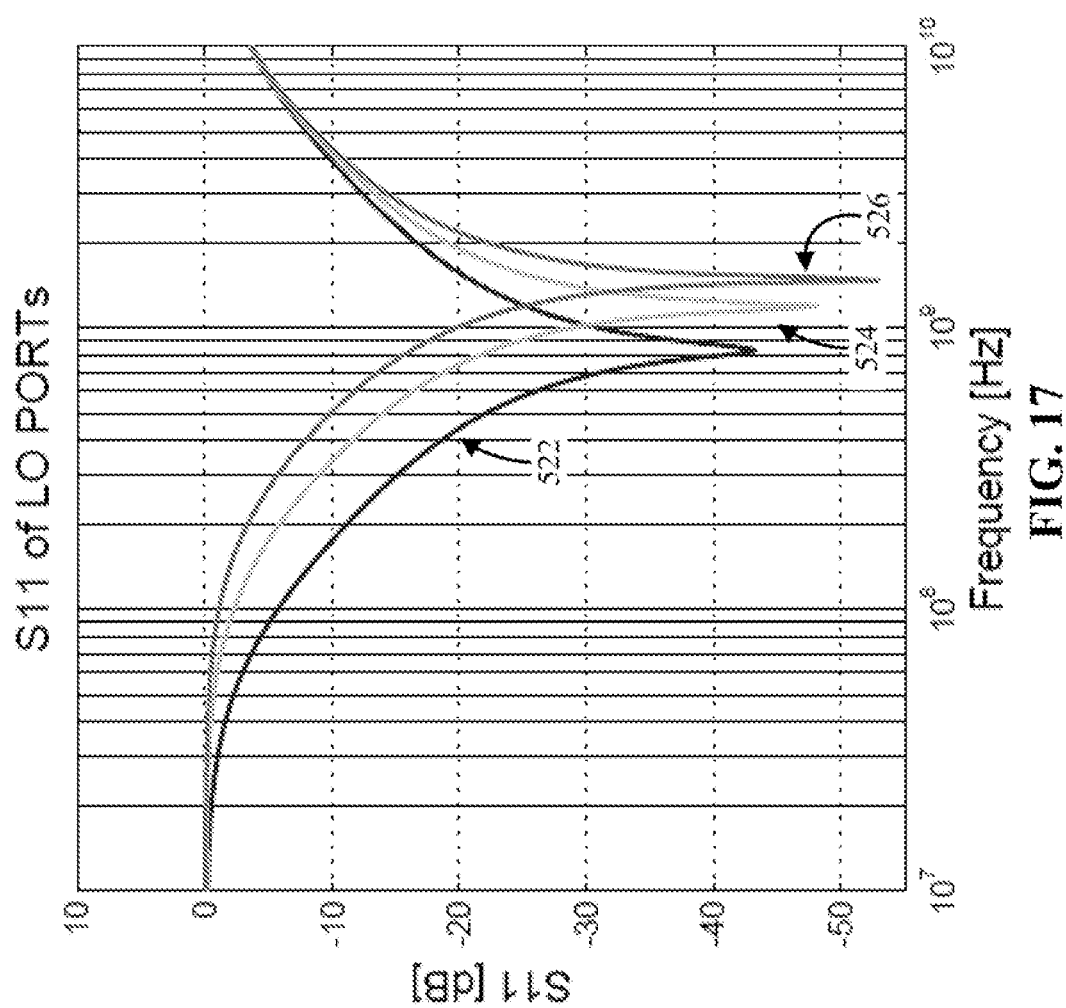
FIG. 17 shows an example of an amount of power reflected from an input port of a local oscillator buffer described in connection with FIGS. 5, 15 and 16 versus input frequency that can be realized in accordance with some embodiments of the disclosed subject matter.

FIG. 17 shows an example of the power rejected from an input of local oscillator buffer 1502 (e.g., S11 of the LO port) over a range of frequencies for the local oscillator input that can be realized in accordance with some embodiments. As shown in FIG. 17, the power rejected at the input of the local oscillator buffer in each of switches 522-526 is illustrated in accordance with some embodiments.

In some embodiments, the size of PMOS transistors in the inverters and NOR gates of local oscillator buffer 1502 can be 16 fingers and 32 fingers, respectively, and the NMOS transistors can be 10 fingers in both the inverters and the NOR gates. Additionally, the size of NMOS transistors in MOS switch 1504 can vary according to an ON-resistance required for a particular path in which the MOS switch is to be used. For example, the size of the NMOS transistors in switch 522 can be 60 fingers, the size of the NMOS transistors in switch 524 can be 20 fingers, and the size of the NMOS transistors in switch 526 can be 12 fingers.

Figure 18:
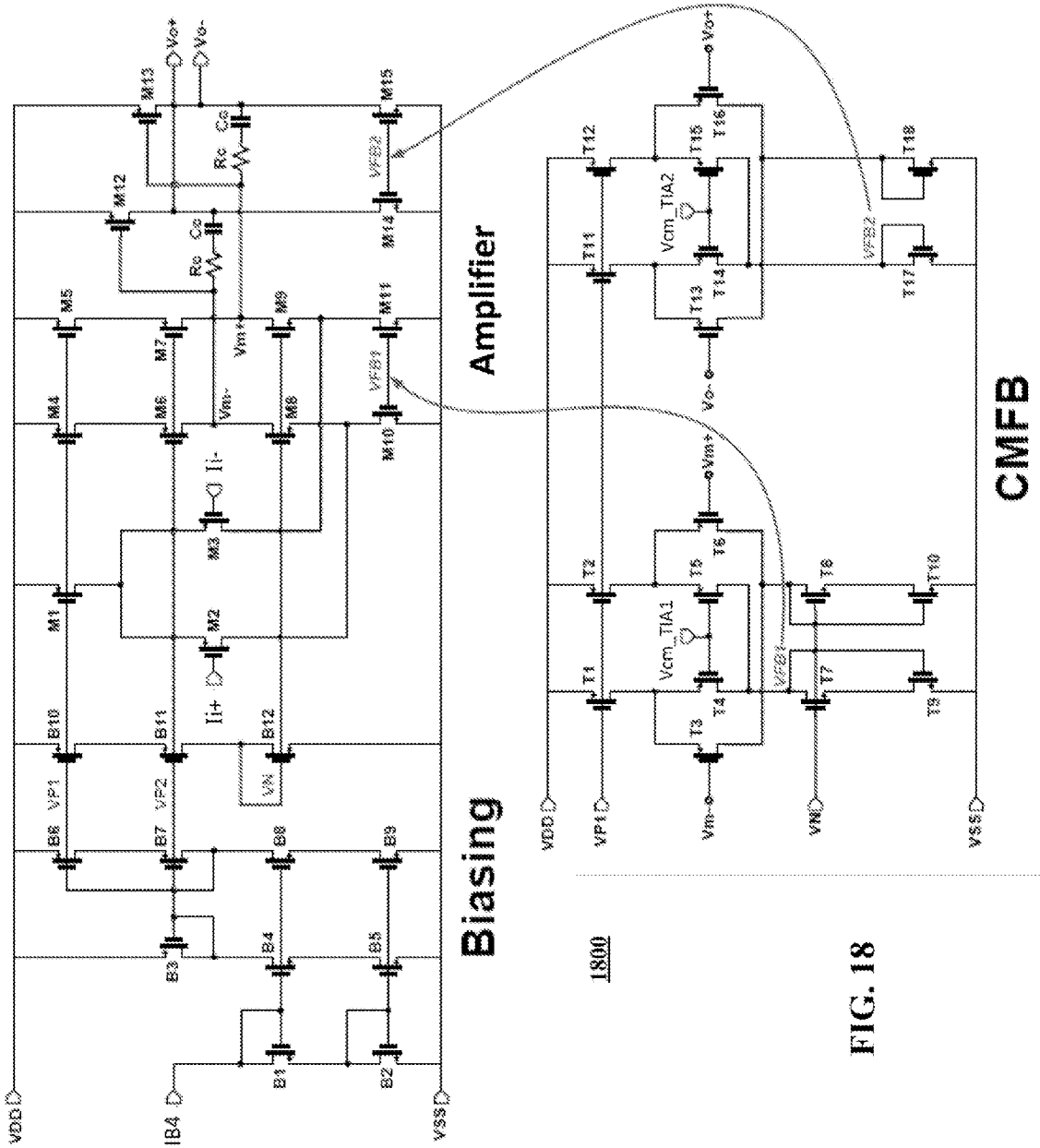
FIG. 18 shows an example of a schematic diagram of an operational transconductance amplifier that can be used to realize a transimpedance amplifier in accordance with some embodiments of the disclosed subject matter.

FIG. 18 shows an example 1800 of a schematic diagram of a transimpedance amplifier that can be used in accordance with some embodiments. For example, transimpedance amplifier 1800 can be used as OTA 532 to convert a summed current signal output by transconductors 502-506.

As shown in FIG. 18, operational transconductance amplifier 1800 can include a biasing stage (e.g., including transistors B1-B12), an amplifier stage (e.g., including transistors M1-M15, compensation capacitors Cc, and series resistors Rc), and a common mode feedback stage (e.g., including transistors T1-T18).

In some embodiments, the biasing stage can receive a biasing current (e.g., biasing current IB4) as shown in FIG. 18, which can control an operating range of the amplifier stage to maintain linear operation of the amplifier stage. For example, a biasing current of 200 microamperes (μA) can be provided to the biasing stage.

In some embodiments, the amplifier stage can receive current inputs Ii+ and Ii− at the gates of transistors M2 and M3 respectively, which can be differential signals of a down-converted signal that results from combining the outputs of one or more of transconductors 502-506.

The amplifier stage can convert the input current signals (e.g., Ii+ and Ii−) to output voltage signals (Vo+ and Vo−) with an amplitude that is proportional to the amplitude of the input current. An operating range of the amplifying stage can be controlled based on the common mode feedback stage of transimpedance amplifier 1800.

The common mode feedback stage can receive a positive voltage and negative voltage from nodes Vm+ and Vm− of the amplifier stage, and the output voltages of the amplifier stage Vo+ and Vo−. The common mode feedback stage can also receive control voltages Vcm_TIA1 and Vcm_TIA2, as shown in FIG. 18. These received voltages and control voltages can be used to provide feedback voltages VFB1 and VFB2 to the amplifier stage. In some embodiments, components used to make OTA 532 can be chosen to set the input impedance (Rin) of transimpedance amplifier to be relatively low in compared with an output resistance of transconductors 502-506. For example, components with values according to table 2 can be used to make OTA 532.

TABLE 2

Transistors Properties for Transimpedance Amplifier in some embodiments

| Transistor | Type | Size (Fingers) | $I_D$ (μA) | $g_m$ (mS) | $g_{ds}$ (μS) | Remark |
|---|---|---|---|---|---|---|
| B1 | N | 30 | 194 | 2.5 | 221 | Biasing |
| B2 | N | 30 | 194 | 2.5 | 221 | — |
| B3 | P | 4 | 184 | 0.76 | 88 | — |
| B4 | N | 30 | 184 | 2.2 | 553 | — |
| B5 | N | 30 | 184 | 2.4 | 220 | — |
| B6 | P | 30 | 193 | 2.3 | 395 | — |
| B7 | P | 30 | 193 | 2.3 | 382 | — |
| B8 | N | 30 | 193 | 2.5 | 227 | — |
| B9 | N | 30 | 193 | 2.5 | 221 | — |
| B10 | P | 30 | 196 | 2.3 | 389 | — |
| B11 | P | 30 | 196 | 2.4 | 333 | — |
| B12 | N | 4 | 196 | 0.89 | 94 | — |
| M1 | P | 240 | 1494 | 17.8 | 1629 | AMP |

TABLE 2-continued

Transistors Properties for Transimpedance Amplifier in some embodiments

| Transistor | Type | Size (Fingers) | $I_D$ (μA) | $g_m$ (mS) | $g_{ds}$ (μS) | Remark |
|---|---|---|---|---|---|---|
| M2 M3 | P | 200 | 747 | 10.6 | 1000 | — |
| M4 M5 | P | 30 | 198 | 2.33 | 386 | — |
| M6 M7 | P | 30 | 198 | 2.37 | 321 | — |
| M8 M9 | N | 50 | 198 | 2.88 | 266 | — |
| M10 M11 | N | 25 | 945 | 13.9 | 1300 | — |
| M12 M13 | P | 40 | 862 | 6.28 | 704 | — |
| M14 M15 | P | 60 | 862 | 8.24 | 672 | — |
| T1 T2 | P | 8 | 50.4 | 0.6 | 107 | CMFB |
| T3 T4 T5 T6 | P | 8 | 25.2 | 0.35 | 35 | — |
| T7 T8 | N | 16 | 50.4 | 0.65 | 550 | — |
| T9 T10 | N | 16 | 50.4 | 0.75 | 75 | — |
| T11 T12 | P | 8 | 50 | 0.59 | 110 | — |
| B13 B14 T15 T16 | P | 8 | 25 | 0.36 | 36 | — |
| B17 B18 | N | 4 | 50 | 0.5 | 45 | — |

In table 2, "transistor" refers to the label of the transistor in FIG. 18, "type" refers to NMOS (N) or PMOS (P), "size" is given in fingers (e.g., a number of individual transistors used to make a transistor that is capable of handling more powerful signals), drain current ("$I_D$") is given in microamperes (μA), transconductance of the transistor ("$g_m$") is given in millisiemens (mS), and the drain-source transconductance ("$g_{ds}$") of the transistor is given in microsiemens (μS). Additionally, series resistors (Rc) can resistance values on the order of about 500 Ohms, and compensation capacitors (Cc) can have capacitances on the order of about 150 fF. In a more particular example, series resistors (Rc) can resistance values of about 518 Ohms, and compensation capacitors (Cc) can have capacitances of about 142 fF.

Figure 19:
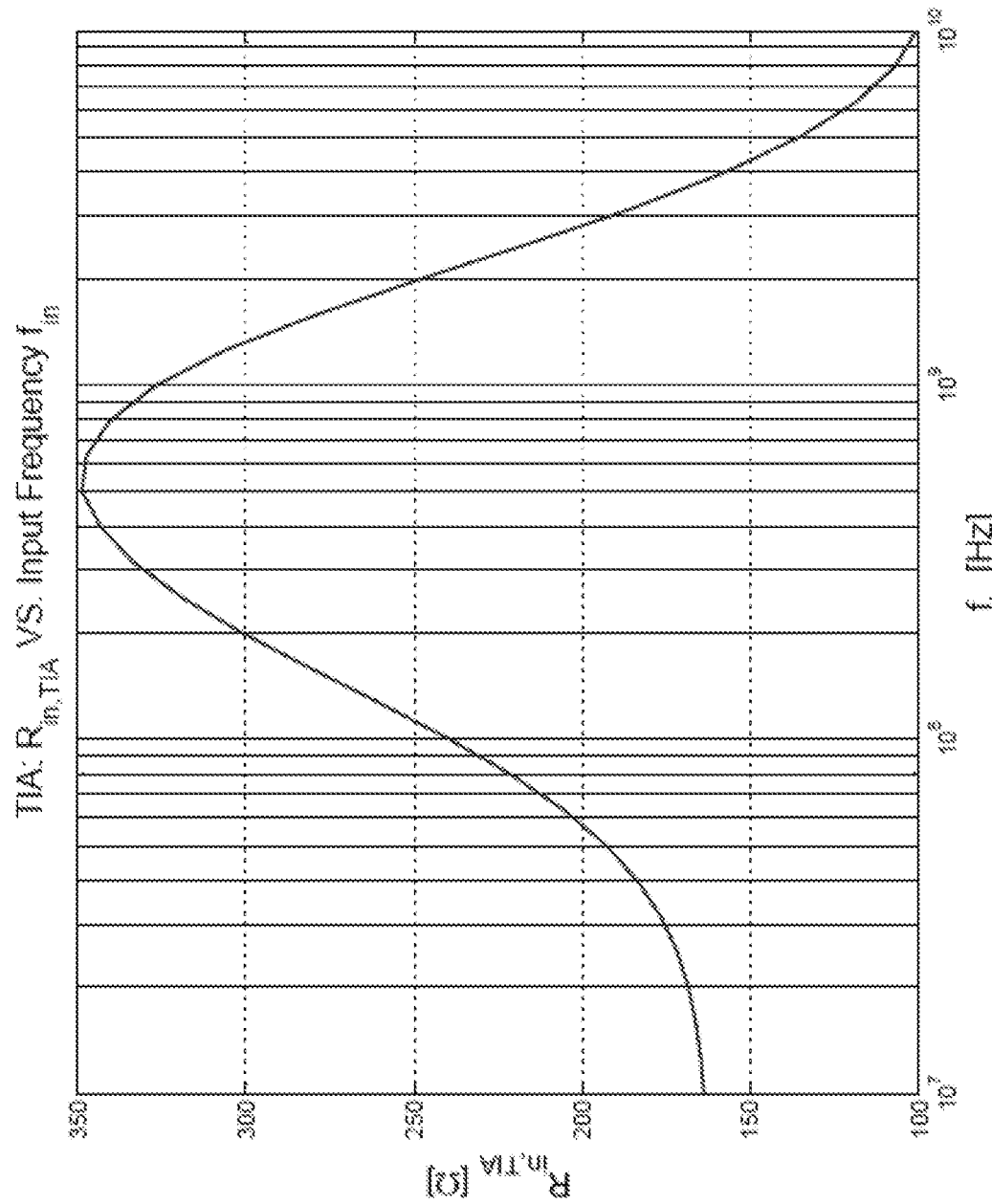
FIG. 19 shows an example of an input impedance of a transimpedance amplifier as described in connection with FIGS. 5 and 18 versus input frequency to the transimpedance amplifier that can be realized in accordance with some embodiments of the disclosed subject matter.

FIG. 19 shows an example of an input impedance of transimpedance amplifier 1800 versus an input frequency to the transimpedance amplifier that can be realized in accordance with some embodiments. As shown in FIG. 19, the input impedance can vary with a change in input frequency, which can affect the effective transconductance of transconductors to which transimpedance amplifier is coupled as a load (e.g., transconductors 502-506), as described above in connection with FIG. 7.

Figure 20:
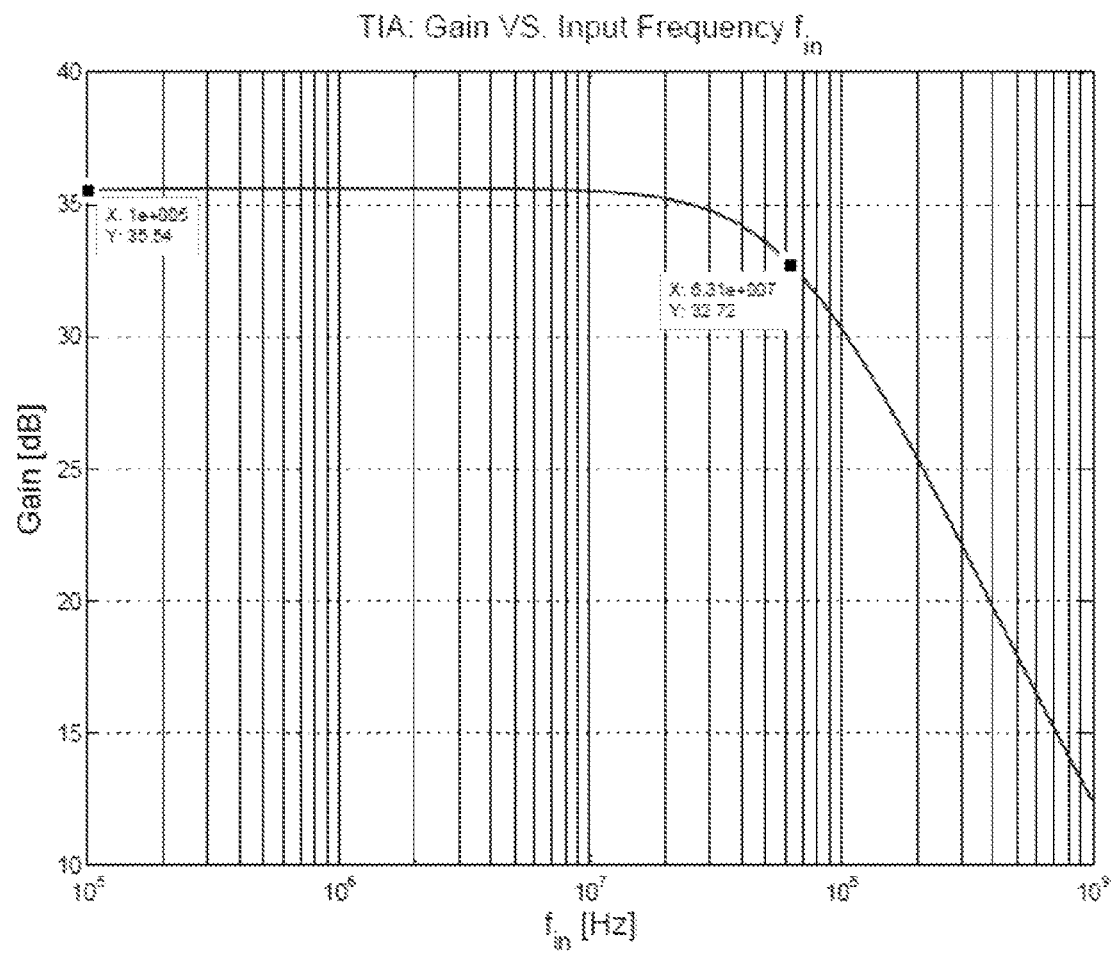
FIG. 20 shows an example of a gain of a transimpedance amplifier as described in connection with FIGS. 5 and 18 versus input frequency to the transimpedance amplifier that can be realized in accordance with some embodiments of the disclosed subject matter.

In some embodiments, transimpedance amplifier can act as low-pass filter for a signal that results from combining the outputs of the switching mixer in the main path and one or more signals output by switches in the auxiliary paths. FIG. 20 shows an example of a gain of transimpedance amplifier 1800 versus input frequency to transimpedance amplifier 1800 in accordance with some embodiments. As shown in FIG. 20, the gain of transimpedance amplifier can decrease about 3 dB at a frequency of approximately 60 MHz.

Figure 21:
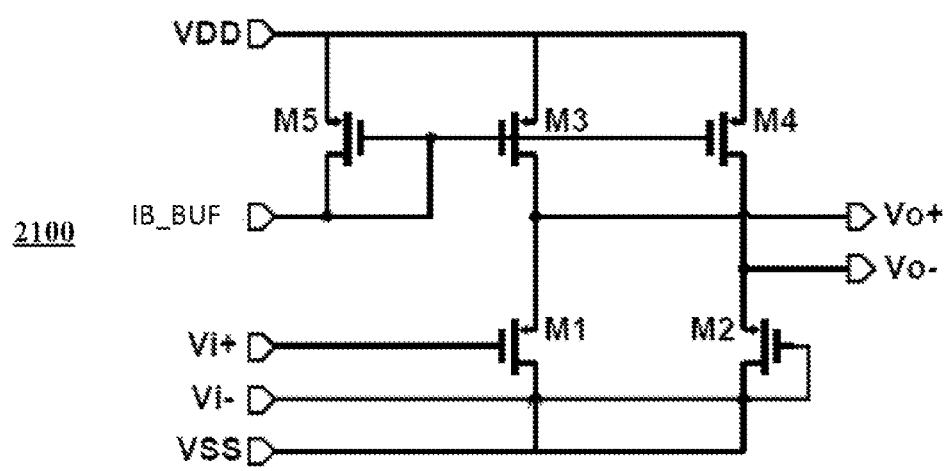
FIG. 21 shows an example of a schematic diagram of an output buffer that can be used in some embodiments of the disclosed subject matter.

FIG. 21 shows an example 2100 of a schematic diagram of an output buffer that can be used in accordance with some embodiments of the disclosed subject matter. For example, output buffer 2100 can be used as output buffer 542 in harmonic rejection mixer 500 to provide a consistent output resistance for harmonic rejection mixer 500. As shown in FIG. 21, output buffer 2100 can receive an input voltage (e.g., Vi+ and Vi−), and a bias current (e.g., IB_BUF), and can output an output voltage (e.g., Vo+ and Vo−). In some embodiments, output buffer 2100 can have an output resistance set to match an input impedance of a component that the harmonic rejection mixer that incorporates output buffer 2100. For example, output buffer 2100 can have an output resistance of 50Ω to facilitate signal coupling to a component that receives the intermediate frequency signal output by HRM 500. As a more particular example, this can limit reflections caused by a mismatch between the output resistance of harmonic rejection mixer 500 and a component that receives the output of harmonic rejection mixer 500.

In some embodiments, components used to make output buffer 542 can be chosen to set the output resistance of output buffer 542 to be about 50Ω. For example, components with values according to table 3 can be used to make output buffer 542.

TABLE 3

Transistors Properties for Output Buffer in some embodiments

| Transistor | Type | Size (Fingers) | $I_D$ (μA) | $g_m$ (mS) | $g_{ds}$ (μS) |
|---|---|---|---|---|---|
| M1 M2 | P | 400 | 1210 | 18.1 | 1490 |
| M3 M4 | P | 80 | 1210 | 10.1 | 1940 |
| M5 | P | 40 | 847 | 6.2 | 706 |

In table 3, "transistor" refers to the label of the transistor in FIG. 21, "type" refers to PMOS (P), "size" is given in fingers (e.g., a number of individual transistors used to make a transistor that is capable of handling more powerful signals), drain current ("$I_D$") is given in microamperes (μA), transconductance of the transistor ("$g_m$") is given in millisiemens (mS), and the drain-source transconductance ("$g_{ds}$") of the transistor is given in microsiemens (μS).

The mechanisms described herein can be used in a variety of applications. For example, the mechanisms described herein can be used in a cognitive radio receiver to reject signals created by signals received by an antenna of the receiver that are not at the target frequency. As another example, the mechanisms described herein can be used in a tuner for a broadband television receiver, in which the harmonic rejection mixer can be used to select a target input signal and reject noise caused by signals at non-selected frequencies. As yet another example, the mechanisms described herein can be used in a radio frequency transmitter to inhibit signals other than a target intermediate frequency from being transmitted.

Figure 22:
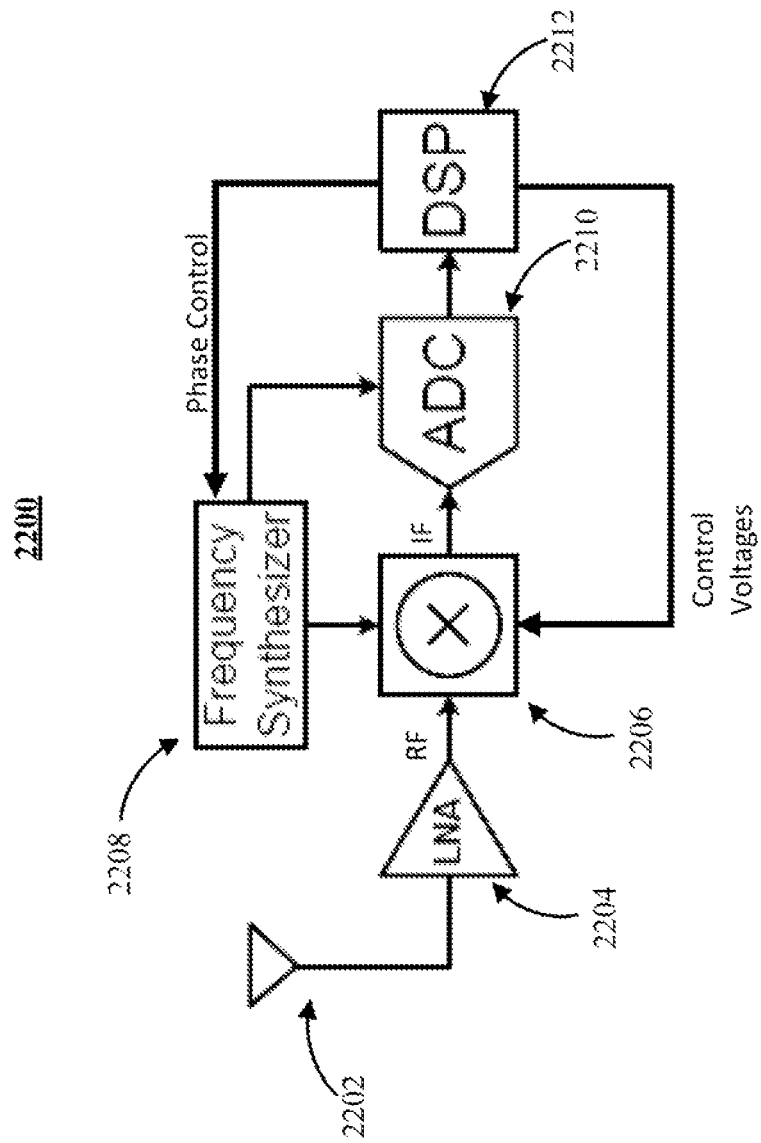
FIG. 22 shows an example of a cognitive radio receiver that can use a harmonic rejection mixer in accordance with some embodiments of the disclosed subject matter.

FIG. 22 shows an example 2200 of a block diagram of a cognitive radio receiver in accordance with some embodiments of the disclosed subject matter. As shown in FIG. 22, cognitive radio receiver 2200 can include an antenna 2202 and a broadband low-noise amplifier 2204. An output of low-noise amplifier 2204 can be provided to a harmonic rejection mixer 2206 that uses the mechanisms described herein. HRM 2206 can receive the input signal from LNA 2204, and can receive local oscillator signals (e.g., LO1x, LO3x, and LO5x) from a frequency synthesizer 2208.

In some embodiments, frequency synthesizer 2208 can provide local oscillator signals at various frequencies, and can be configured to control a phase of each of the local oscillator signals with respect to one another.

In some embodiments, HRM 2206 can also receive control voltages (e.g., Vc1, Vc2, and Vc3) for controlling a gain of amplifiers in various paths of HRM 2206 (e.g., transconductors 502-506). Additionally, frequency synthesizer 2208 can receive phase control signals for controlling phase of the various local oscillator signals.

In some embodiments, an output signal at the desired intermediate frequency can be output by HRM 2206 to an analog to digital converter 2210, which can receive a clock signal from frequency synthesizer 2208.

In some embodiments, an output of the ADC 2210 can be received at a digital signal processor 2212, and can be used to generate any suitable output. For example, information included in the input signal can be extracted and used to create an output signal for presentation to a user. As a more particular example, if the input signal is voice data transmitted over a mobile telephone network, DSP 2212 can extract information from the digital signal output by ADC 2210 to drive a speaker and create an audio output. As another example, if the input signal is positioning information (e.g., global positioning system information), DSP 2212 can use the information to determine a location of a device that includes HRM 2206 and DSP 2212.

In some embodiments, DSP 2212 can access a memory that includes a lookup table (e.g., created using process 600 or any other suitable process) for controlling HRM 2206 based on a target input frequency. DSP 2212 can use the lookup table to generate control voltages (e.g., control voltages Vc1, Vc2, etc.) and signals for controlling the phase of the local oscillator generated by frequency synthesizer 2208.

Accordingly, circuits and methods for performing harmonic rejection mixing are provided.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

It should be noted that, as used herein, the term mechanism can encompass hardware, software, firmware, or any suitable combination thereof.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed:

1. A circuit for performing harmonic rejection mixing, the circuit comprising:
   a first amplifier that outputs a first amplified signal by amplifying a received signal using a first gain;
   a second amplifier that outputs a second amplified signal by amplifying the received signal using a second gain that is a fraction of the first gain;
   a third amplifier that outputs a third amplified signal by amplifying the received signal using a third gain that is a second fraction of the first gain;
   a first mixer that receives (i) a first local oscillator signal having a first fundamental frequency and (ii) the first amplified signal of the first amplifier, and outputs a first mixed signal created by mixing the first local oscillator signal with the first amplified signal of the first amplifier;

a second mixer that receives (iii) a second local oscillator signal having a second fundamental frequency that is a multiple of the first fundamental frequency and that is different from the first fundamental frequency and (iv) the second amplified signal of the second amplifier, and outputs a second mixed signal created by mixing the second local oscillator signal with the second amplified signal of the second amplifier;

a third mixer that receives (v) a third local oscillator signal having a third fundamental frequency that is a second multiple of the first fundamental frequency and (vi) the third amplified signal of the third amplifier, and outputs a third mixed signal created by mixing the third local oscillator signal with the third amplified signal of the third amplifier, wherein a rising edge of the second local oscillator signal and a rising edge of the third local oscillator signal are substantially aligned with a falling edge of the first local oscillator signal; and an output stage that receives the first mixed signal, the second mixed signal and the third mixed signal, and outputs a combined signal that includes a sum of the first mixed signal and the second mixed signal.

2. The circuit of claim 1, wherein the first amplifier is a first transconductor that converts the received signal from a voltage signal to a first current signal using the first gain, and the second amplifier is a second transconductor that converts the received signal from the voltage signal to a second current signal using the second gain.

3. The circuit of claim 2, wherein the first mixer and second mixer are passive mixers, and wherein the first mixed signal is a current signal based on the first current signal output by the first transconductor and the second mixed signal is a current signal based on the second current signal output by the second transconductor.

4. The circuit of claim 3, wherein the output stage further comprises:

a node that receives the first mixed signal and the second mixed signal and outputs the combined signal;

a transimpedance amplifier that converts the combined signal from a current signal to a voltage signal.

5. The circuit of claim 2, wherein a transconductance of the first transconductor is set at about three times the transconductance of a transconductance of the second transconductor.

6. The circuit of claim 2, wherein the first transconductor comprises a degenerative transistor that changes resistance based on a first control voltage, and wherein an effective transconductance of the first transconductor is based on the resistance of the degenerative transistor.

7. The circuit of claim 1, wherein a ratio of the first gain to the second gain is 3:1.

8. The circuit of claim 1, wherein the second fundamental frequency is about three times the first fundamental frequency.

9. The circuit of claim 1, wherein the received signal is an RF signal and wherein the first mixed signal and the second mixed signal are IF signals.

10. The circuit of claim 1, wherein the received signal is an IF signal and wherein the first mixed signal and the second mixed signal are RF signals.

11. A method for performing harmonic rejection mixing, the method comprising:

amplifying a received signal using a first gain to produce a first amplified signal;

amplifying the received signal using a second gain that is a fraction of the first gain to produce a second amplified signal;

amplifying the received signal using a third gain that is a second fraction of the first gain to produce a third amplified signal;

mixing (i) a first local oscillator signal having a first fundamental frequency and (ii) the first amplified signal to produce a first mixed signal;

mixing (iii) a second local oscillator signal having a second fundamental frequency that is a multiple of the first fundamental frequency and that is different from the first fundamental frequency and (iv) the second amplified signal to produce a second mixed signal;

mixing (vi) a third local oscillator signal having a third fundamental frequency that is a second multiple of the first fundamental frequency and (vii) the third amplified signal to produce a third mixed signal, wherein a rising edge of the second local oscillator signal and a rising edge of the third local oscillator signal are substantially aligned with a falling edge of the first local oscillator signal;

outputting a combined signal by summing the first mixed signal, the second mixed signal and the third mixed signal.

12. The circuit of claim 11, wherein amplifying the received signal using the first gain comprises converting the received signal from a voltage signal to a first current signal with a current that is proportional to the voltage at a ratio of the first gain, and wherein amplifying the received signal using the second gain comprises converting the received signal from the voltage signal to a second current signal with a current that is proportional to the voltage at a ratio of the second gain.

13. The method of claim 12, wherein mixing the first amplified signal with the first local oscillator signal comprises operating a first passive switch with the first local oscillator signal and the first amplified signal as inputs to the first passive switch, and mixing the second amplified signal with the second local oscillator signal comprises operating a second passive switch with the second local oscillator signal and the second amplified signal as inputs to the second passive switch, and wherein the first mixed signal is a current signal based on the first current signal and the second mixed signal is a current signal based on the second current signal.

14. The method of claim 13, wherein outputting the combined signal further comprises converting the combined signal from a current signal to a voltage signal.

15. The method of claim 12, wherein the first gain is a first effective transconductance set at about three times the second gain, and wherein the second gain is a second effective transconductance.

16. The method of claim 12, further comprising controlling the first gain using a first control voltage to control a first degenerative resistance, and wherein the first gain is an effective transconductance based on the resistance of the degenerative resistance.

17. The method of claim 11, wherein a ratio of the first gain to the second gain is 3:1.

18. The method of claim 11, wherein the second fundamental frequency is about three times the first fundamental frequency.

19. The method of claim 11, wherein the received signal is an RF signal and wherein the first mixed signal and the second mixed signal are IF signals.

20. The method of claim 11, wherein the received signal is an IF signal and wherein the first mixed signal and the second mixed signal are RF signals.

* * * * *